United States Patent [19]
Sakakibara et al.

[11] Patent Number: 5,343,270
[45] Date of Patent: Aug. 30, 1994

[54] PROJECTION EXPOSURE APPARATUS

[75] Inventors: Yasuyuki Sakakibara, Ichikawa; Susumu Makinouchi, Zama; Nobutaka Magome; Naomasa Shiraishi, both of Kawasaki, all of Japan

[73] Assignee: Nikon Corporation, Tokyo, Japan

[21] Appl. No.: 986,630

[22] Filed: Dec. 7, 1992

Related U.S. Application Data

[63] Continuation-in-part of Ser. No. 946,013, Sep. 15, 1992, which is a continuation of Ser. No. 820,244, Jan. 14, 1992, abandoned, which is a continuation-in-part of Ser. No. 709,278, Jun. 3, 1991, abandoned.

[30] Foreign Application Priority Data

| | | | |
|---|---|---|---|
| Oct. 30, 1990 | [JP] | Japan | 2-293162 |
| Sep. 11, 1991 | [JP] | Japan | 3-231530 |
| Dec. 12, 1991 | [JP] | Japan | 3-328907 |

[51] Int. Cl.⁵ .................................................. G03B 27/42
[52] U.S. Cl. ......................................... 355/53; 355/77; 430/311
[58] Field of Search ................ 355/43, 45, 53, 46, 355/77, 68, 69; 430/311, 397

[56] References Cited

U.S. PATENT DOCUMENTS 4,869,999 9/1989 Fukuda et al. .................. 430/311

FOREIGN PATENT DOCUMENTS 0489426 10/1992 European Pat. Off.
58-17446 2/1983 Japan.

OTHER PUBLICATIONS

Patent Abstracts of Japan, vol. 7, No. 90 (P-191) Apr. 14, 1983.
IBM Technical Disclosure Bulletin, vol. 32, No. 1, Jun. 1989, New York US, pp. 125-127; 'Extended Focal Depth Microlithography'.

Primary Examiner—D. Rutledge
Attorney, Agent, or Firm—Shapiro and Shapiro

[57] ABSTRACT

In a projection exposure apparatus wherein a stage is moved in the direction of optic axis when a mask formed with a predetermined pattern is projected by a shutter onto a photosensitive substrate placed on the stage through a projection optical system, the operations of control means for the shutter and control means for the stage are interlocked with each other on the basis of the operational characteristic of the shutter and the operational characteristics (particularly the speed characteristic) of the stage so that the distribution of the existence probability with respect to movement of the photosensitive substrate from the opening operation starting point of time till the closing operation completing point of time of the shutter, with respect to the direction of the optic axis, may assume substantially equal maximum values at at least two locations in the direction of the optic axis.

14 Claims, 15 Drawing Sheets

PROJECTION EXPOSURE APPARATUS

This is a continuation-in-part of application Ser. No. 946,013 filed Sep. 15, 1992, which is a continuation of application Ser. No. 820,244 filed Jan. 14, 1992 (now abandoned), which is a continuation-in-part of application Ser. No. 709,278 filed Jun. 3, 1991 (now abandoned).

BACKGROUND OF THE INVENTION

1. Field of the Invention

This invention relates to an apparatus for projecting and exposing a semiconductor circuit pattern, a liquid crystal display element pattern or the like onto a photosensitive substrate.

2. Related Background Art

In a projection exposure apparatus of this kind, the exposure of a reticle pattern has heretofore been effected with the surface of a photosensitive substrate (a semiconductor wafer or a glass plate having a resist layer applied thereto) disposed on the best imaging plane of a projection optical system (a plane conjugate with the reticle).

However, the area exposed once on the wafer (the shot area) is of the order of 15 mm square to 20 mm square, and if the surface of the wafer is minutely curved in that area or there is unevenness of the order of several μm in the surface structure, there will appear in the shot area a portion which exceeds the depth of focus of the projection optical system. This is because the depth of focus of the projection optical system is only ±1 μm or so on the image side (the wafer side).

So, a method whereby exposure can be effected at an effectively wide depth of focus even in an exposure apparatus having a projection optical system of a small depth of focus has been proposed in U.S. Pat. No. 4,869,999. In the method disclosed in this patent, a wafer is moved to two or three points in the direction of the optic axis of the projection optical system and one and the same reticle pattern is multiplexly exposed at each point. In this method, two points distant in the direction of the optic axis are made nearly as wide as the depth of focus $\pm \Delta Z$ of the projection optical system, thereby enlarging the actually effective depth to the order of 1.5–3 times.

In addition to the method as described in the above-mentioned patent wherein the wafer is positioned at each of multiple points in the direction of the optic axis and exposure is repeated, there has been proposed a method whereby the wafer is continuously moved (or vibrated) in the direction of the optic axis during an exposure operation for one shot area.

A semiconductive integrated circuit is manufactured by the steps of film formation, pattern transfer, etching, etc. being repeated several to ten and several times. Therefore, in some cases, portions in which film corresponding to several layers is laminated and portions in which no film is laminated are mixedly present on the surface of a wafer which is in the process of forming an integrated circuit. The thickness of a layer in the film is of the order of 0.1 μm to 1 μm, and the level difference on the wafer surface (in one shot area) may be of the order of several μm at greatest. On the other hand, the depth of focus of the projection optical system is generally expressed as $\pm \lambda / 2 \cdot NA^2$, where $\lambda$ is the wavelength of illuminating light for exposure, and NA is the numeral aperture of the image plane side of the projection optical system. In the latest projection optical systems, $\lambda = 0.385$ μm (the i-line of a mercury lamp) and $NA \simeq 0.5$, and the depth of focus $\Delta Z$ in this case is about $\pm 0.73$ μm.

Accordingly, when as in the prior art, exposure is effected with a wafer fixedly disposed on the best imaging plane of the projection optical system, both the top and bottom of the level difference on the wafer become distant in the direction of the optic axis by more than the depth of focus of $\pm 0.73$ μm relative to the best imaging plane (the best focus plane) and thus, image formation becomes impossible.

Also, according to a method whereby as in the prior art, exposure is effected plural times with a wafer positioned at multiple points separate in the direction of the optic axis, it is possible to cope with a level difference of several μm on the wafer, but a shutter system must be driven to stop and resume exposure at multiple points in the direction of the optic axis, and this has led to the problem that the wafer treating ability per unit time is greatly reduced under the influences of the driving of a drive stage (Z stage) in the direction of the optic axis (Z direction) of a wafer holder, the positioning operation characteristic and the opening and closing of the shutter.

So, an example of the prior-art exposure method will hereinafter be described with reference to FIGS. 1A–1C of the accompanying drawings. FIGS. 1A and 1B show the time charts of the shutter operation (the variation in the illumination on a wafer) and the Z stage operation when multiplex exposure is effected at two focus positions to one shot area, and FIG. 1C shows the time chart of the shutter operation in a normal mode in which multiplex exposure is not effected.

Here, it is to be understood that during multiplex exposure and during normal exposure, the same exposure amount is provided to one shot area on a wafer. In the case of normal exposure, assuming that the operation time Ta until the closed shutter is opened and the operation time Tb until the shutter is closed from its fully open state are of a substantially equal value (Tc), a proper exposure amount BV is $BV = (Tc + T_O') \times IL$, where $T_O'$ is the fully open time of the shutter, and IL represents the illumination of the surface of the wafer. Also, in FIGS. 1A and 1C, the ordinate OP. represents the fully open state of the shutter and CL. represents the fully closed state of the shutter. Further, in FIG. 1, time Tst represents the stepping time to the next shot area of the wafer stage.

On the other hand, in the case of multiplex exposure, the first exposure is effected with the Z stage set at a position $+Z_1$ upwardly distant from the best focus plane $Z_0$ as shown in FIG. 1B, whereafter the Z stage is re-set at a position $-Z_1$ downwardly distant from the plane $Z_0$ during a time $T_Z$, and then the second exposure is effected.

The operational characteristics (rising and falling) of the shutter do not vary as long as one and the same exposure apparatus is used and therefore, the first exposure time is $Ta + Tb + T_O$, where $T_O$ is the fully open time of the shutter, and if the first exposure amount is about one half of the proper exposure amount BV, the fully open time $T_O$ is defined as follows (but $BV/IL = Tc + T_O'$):

$$T_O = \frac{BV}{2 \cdot IL} - Tc = \tfrac{1}{2}(T_O' - Tc)$$

Thus, as is apparent from Figures assuming that $Ta=Tb=Tc$, in the case of normal sensitization, the overall treatment time which gives the proper exposure amount BV to each shot area on the wafer is ps $$(2Tc+T_O'+Tst)\times \text{the number of shots} \qquad (1)$$

and in the case of multiplex (two times) exposure, said over all treatment time is $$\{2(2Tc+T_O+T_Z+Tst\}\times \text{the number of shots}. \qquad (2)$$

Substituting $T_O=\frac{1}{2}(T_O'-Tc)$ for this expression (2) and rearranging it, $$(3Tc+T_O'+T_Z+Tst)\times \text{the number of shots}. \qquad (3)$$

So, comparing expressions (1) and (3) with each other, it will be seen that in the case of multiplex exposure, the time becomes longer by $(Tc+T_O)$ during each shot.

In the present-day exposure apparatuses (steppers), the time $Tc$ is 10–30 mSec. and the time $T_Z$, although it differs depending on the strokes of positions $+Z_1$ and $-Z_1$, is of the order of 20–50 mSec. Therefore, the time becomes longer by the order of 30–80 mSec during each shot, and assuming that there are 100 shot areas on a wafer, the treatment of one wafer may become longer by 3 to 8 sec.

As described above, the prior-art method has suffered from a problem is the throughput of wafer treatment.

SUMMARY OF THE INVENTION

The present invention has been made in view of the above-noted problem and the object thereof is to provide a projection exposure apparatus in which the substantial depth of focus is enlarged and at the same time, the reduction in throughput is decreased and in addition, the controllability of exposure amount is secured.

To achieve this object, the present invention is constructed as follows.

A Z stage is moved in the direction of the optic axis during exposure of a photosensitive substrate.

Interlocking means for interlocking the operations of control means for a shutter and control means for the Z stage is provided so that on the basis of the operational characteristics of the shutter and the operational characteristics (particularly the speed characteristic) of a movable stage (Z stage), the distribution of the existence probability (i.e., the existence time per unit length in the Z direction) obtained under the movement of said substrate photosensitive substrate (a resist layer on a wafer) from a point of time at which the shutter starts to be closed till a point of time at which the shutter is completely closed, with respect to the direction of the optic axis may assume substantially equal maximum values at least two locations in the direction of the optic axis.

In the present invention, there is adopted a system for moving the photosensitive substrate such as the wafer and the projected image relative to each other in the direction of the optic axis while the shutter is open, so as to endow the opening-closing control characteristic of the shutter and the movement control characteristic in the direction of the optic axis with a special relation.

The manner of exposure by the prior-art multiplex exposure system will now be described with reference to FIG. 2 of the accompanying drawings.

FIG. 2, (A), (B) and (C) show the manners of multiplex exposure at focus positions $-Z_1$, $Z_0$ and $+Z_1$, respectively, and the low portion, the middle portion and the high portion of the pattern level difference on a wafer are represented as (A), (B) and (C), respectively. The pattern to be subjected to multiplex exposure exists as a hole pattern (a white minute rectangle) formed on a reticle. The intensity distribution of the projected image of this hole pattern on the wafer is shown by Fmn, and $m=1$ represents the focus position $-Z_1$, $m=2$ represents the focus position $Z_0$, $m=3$ represents the focus position $+Z_1$, and $n=1, 2, 3$ represents the number of times (order) of exposure.

When at first, the first exposure is effected with the best imaging plane of a projection lens focused on the low portion (the position $-Z_1$) of the pattern level difference on the wafer, a sharp intensity distribution $F_{11}$ is imaged on the low portion, but toward the middle and high portions, the intensity distribution $F_{11}$, is suddenly deteriorated (decreased in peak value and increased in width). When the second exposure is then effected with the best imaging plane focused on the middle portion (the position $Z_0$) of the pattern level difference, a sharp intensity distribution $F_{22}$ is imaged on the middle portion, but a deteriorated intensity distribution $F_{22}'$ appears on each of the low portion and the high portion. Likewise in the third exposure, focusing is effected on the high portion ($+Z_1$) of the pattern level difference and therefore, a sharp intensity distribution $F_{33}$ is obtained in the high portion, and toward the middle portion and the low portion, a deteriorated intensity distribution $F_{33}'$ is obtained.

When three times of exposure is thus finished, sharp image distributions $F_{11}$, $F_{22}$ and $F_{33}$ are obtained once in any of the low portion, the middle portion and the hight portion of the pattern level difference.

The integrated quantity of light of the intensity distributions $F_{11}$, $F_{22}'$ and $F_{33}'$ is provided to the resist of the low portion, as shown in FIG. 2(A), and the distribution of the integrated quantity of light is as shown in FIG. 2 (D). In FIG. 2 (D), the level Eth indicated by a broken line is the exposure amount necessary to remove positive resist (form a hole pattern). Likewise the integrated quantity of light of the intensity distributions $F_{22}$, $F_{11}'$ and $F_{33}'$ is provided to the resist of the middle portion of the pattern level difference, as shown in FIG. 2(E), and the integrated quantity of light of the intensity distributions $F_{33}$, $F_{11}'$ and $F_{22}'$ is provided to the resist of the high portion of the pattern level difference, as shown in FIG. 2(F). A good image intensity distribution of a hole pattern is provided to any of these three level difference portions and as a result, the apparent enlargement of the depth of focus is accomplished over the width of $2Z_1$ from the high portion to the low portion of the level difference.

Besides the above-described method of effecting multiplex exposure while discretely varying the focus position, the effect of enlarging the depth of focus is also obtained by a method of effecting exposure while continuously moving a wafer in the direction of the optic axis. However, according to the comfirmation through experiments or the like, it has been found that the expected enlarging effect cannot be attained even if a wafer is moved (or vibrated) at random in the direction of the optic axis during the exposure of the wafer (during the opening of the shutter).

Assuming that as a generally conceivable moving system, a Z stage holding a wafer thereon is driven at a uniform speed, the time distribution of the best focus image with respect to the direction of the optic axis, i.e., the so-called existence probability, is shown in FIG. 3 of the accompanying drawings. In FIG. 3, the ordinate represents the focus position (the position of the wafer in the direction of the optic axis) and the abscissa represents the existence probability (i.e., the time per unit length in the direction of the optic axis with which the best focus image exists). In the previously described three-point multiplex exposure, the existence probability has assumed other values than zero only at the three focus positions $+Z_1$, $Z_0$ and $-Z_1$, but in the uniform speed movement of the Z stage, a constant existence probability is assumed over the entire range of $\pm Z_1$, and besides the enlarging effect for the depth of focus, the disadvantage of the aggravated contrast of the exposed resist pattern presents itself remarkably.

Also, in the technique of vibrating the wafer in the direction of the optic axis during the exposure of the wafer, the enlarging effect for the depth of focus may not be sufficiently expected depending on the amplitude, frequency and waveform of the vibration and the exposure time.

So, in the present embodiment, the continuous movements of the wafer and the projection image plane in the direction of the optic axis are controlled so that the existence probability may be maximized at the focus positions $+Z_1$ and $-Z_1$, in other words, two points distant from each other by an amount roughly corresponding to the width of the depth of focus of the projection lens and that in the intermediate portion between the two points, the existence probability may be suppressed low to such an extent that will not cause the deterioration of the contrast of the exposed resist pattern.

DETAILED DESCRIPTION OF THE PREFERRED EMBODIMENTS

Figures 1A, 1B, 1C:
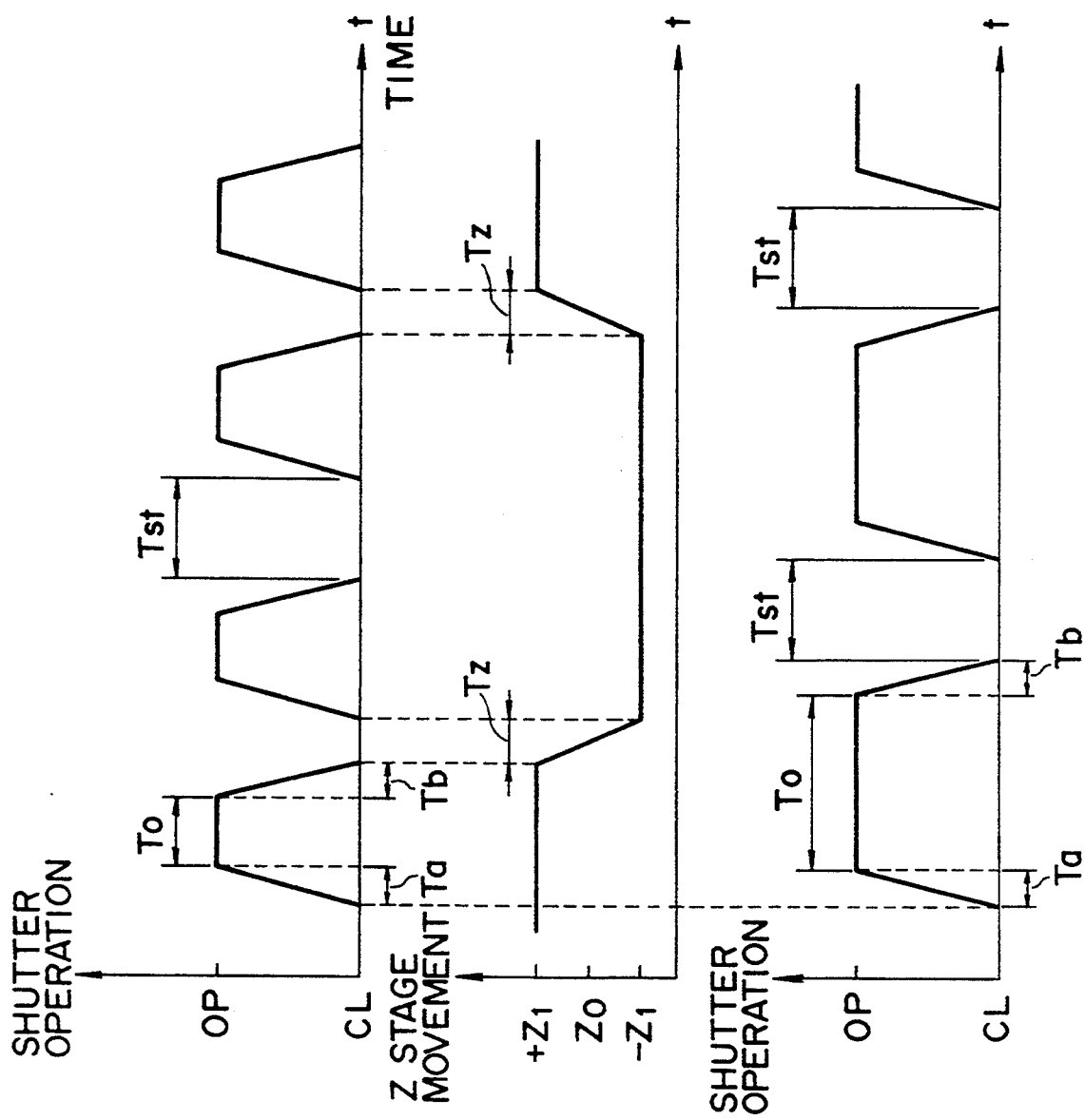
FIGS. 1A–1C are times charts showing the driving sequences of the Z stage and shutter in the multiplex exposure system according to the prior art.
Figure 2:
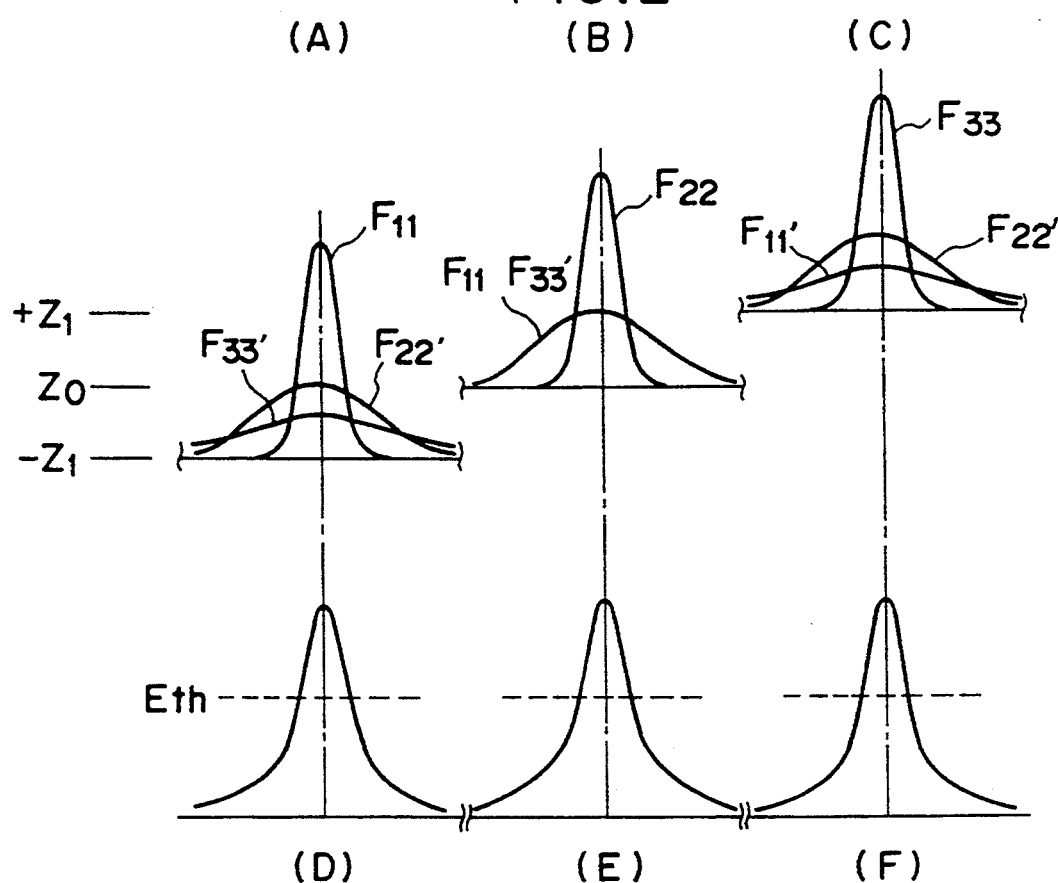
FIG. 2 illustrates the variation in the distribution of quantity of light of a hole pattern when multiplex exposure is effected at three points.
Figure 3:
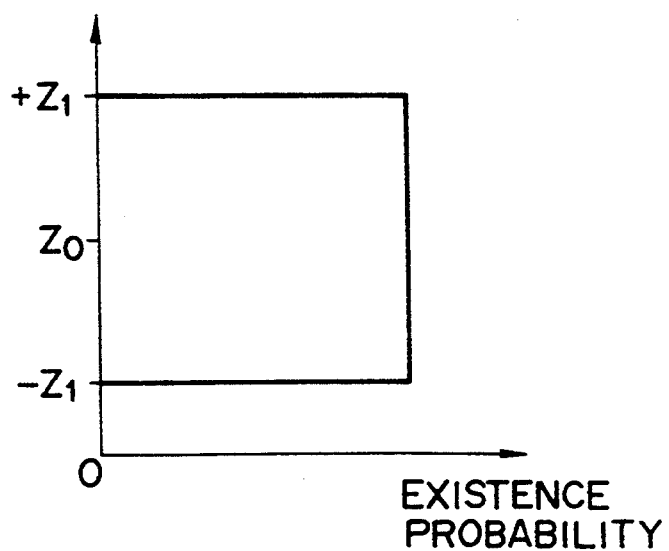
FIG. 3 shows the distribution of exposure amount (existence probability) when exposure is effected while the Z stage is moved at a uniform speed.
Figure 4:
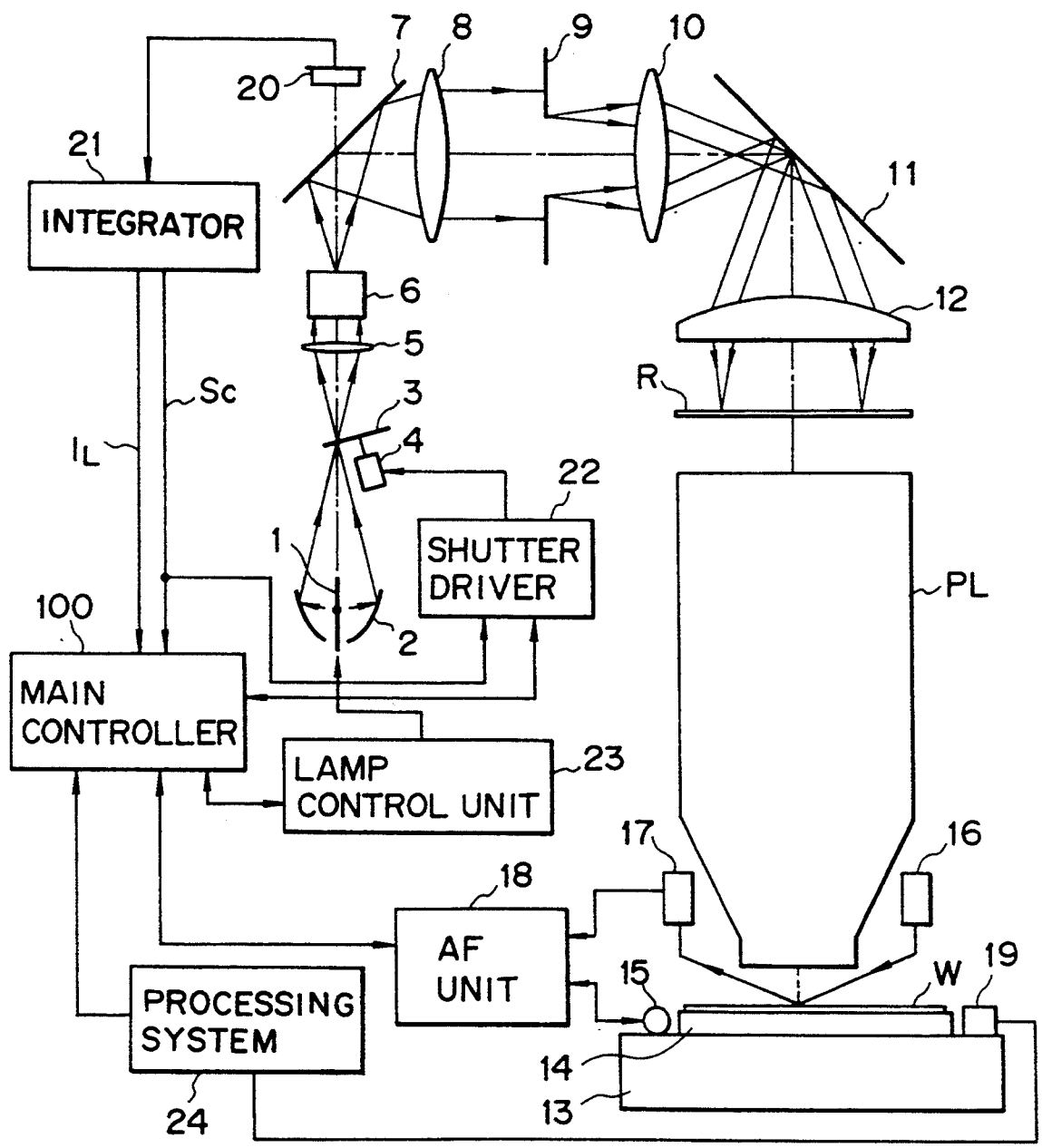
FIG. 4 shows the construction of a projection exposure apparatus according to an embodiment of the present invention.

FIG. 4 shows the construction of a projection exposure apparatus according to an embodiment of the present invention.

In FIG. 4, illuminating light from a mercury discharge lamp 1 is condensed on a second focus by an elliptical mirror 2. A rotary shutter 3 having a plurality of blades is disposed near the second focus for rotation by a motor 4. The illuminating light condensed on the second focus and transmitted through the shutter 3 enters an optical integrator 6 including an input lens 5, a fly-eye lens, etc. A plurality of secondary light source images are formed on the exit surface side of the optical integrator 6, whereby a surface light source is made. The illuminating lights from the respective secondary light source images are reflected by a mirror 7 having a slight transmittance (e.g. of the order of 10%), whereafter they enter a first relay lens system 8 and are integrated by the surface of a reticle blind 9, and illuminate the blind 9 with a uniformized illumination distribution. The blind 9 is for limiting the illuminated range on a reticle R, and the opening image of the blind 9 is formed on the pattern surface of the reticle R through a second relay lens system 10, a mirror 11 and a condenser lens 12.

The illuminating light transmitted through the transparent portion of the pattern of the reticle R passes through a projection lens PL to a wafer W, and the projected image of the reticle pattern is formed near the surface of the wafer W. The wafer W is vacuum-attracted onto the holder of a Z stage 14 disposed on an XY stage 13. The Z stage 14 is moved on the XY stage 13 in the direction of the optic axis of the projection lens PL by a driving portion (a motor and a tachogenerator) 15.

Usually, the Z stage 14 is moved in the direction of the optic axis by the driving portion 15 being servo-operated under the control of an AF unit 18 which inputs a focus signal from an oblique incident light type AF sensor comprised of a light projector 16 and a light receiving device 17. This is an auto-focus operation effected during normal one-time exposure.

A photoelectric sensor 19 for detecting the intensity of the illuminating light (the pattern image of the reticle R or the opening image of the blind 9) passed through the projection lens PL is provided on the XY stage 13.

Now, a photoelectric sensor 20 for detecting the intensity of part of the illuminating light passed through the shutter 3 is disposed rearwardly of the mirror 7, and the photoelectric signal of the photoelectric sensor 20 is input to an integrator circuit 21 which digitally effects the integration of the quantity of light. The integrator circuit 21 outputs to a main control system 100 a signal IL obtained by the photoelectric signal being amplified by a predetermined amount. The signal IL is proportional to the illumination on the reticle R or the illumination on the wafer W. Further, the integrator circuit 21 includes a comparison circuit which outputs the closing signal Sc of the shutter 3 from the main control system 100 when the value of a preset proper exposure amount and the integrated value of the quantity of light coincide with each other. This closing signal Sc is sent to a shutter driver 22, whereby the motor 4 is rotated by a predetermined amount to thereby close the shutter 3. Also, the driver 22 exchanges an opening command for the shutter 3, a shutter status signal, etc. between it and the main control system 100.

In the case of normal one-time exposure, automatic exposure amount control is effected by the loop of the photoelectric sensor 20, integrator circuit 21, shutter driver 22 and motor 4. On the other hand, the mercury discharge lamp (hereinafter simply referred to as the lamp) 1 has its supplied electric power controlled by a lamp control unit 23. In recent years, in steppers, in order to enhance the throughput of exposure, there has been adopted a flash exposure system whereby the supplied electric power to the lamp 1 is increased to about twice the rated electric power only when the shutter 3 is open. The lamp control unit 23 is given a changeover command for the normal exposure system or the flash exposure system from the main control system 100, and in the case of flash exposure, it increases the supplied electric power to the lamp 1 in response to the start of the opening of the shutter 3.

The XY stage 13 in FIG. 4 steps so as to move respective ones of the plurality of shot areas on the wafer W to just beneath the projection lens PL, but this is not directly related to the present invention and therefore, the driving portion and the control system for the XY stage 13 are not shown.

The functional blocks of the main control system 100 relating to the essential portions of the present invention will now be described with reference to FIG. 5. The function of each block in FIG. 5 is achieved by the hardware of an electric circuit or the software of a microcomputer or the like.

Figure 5:
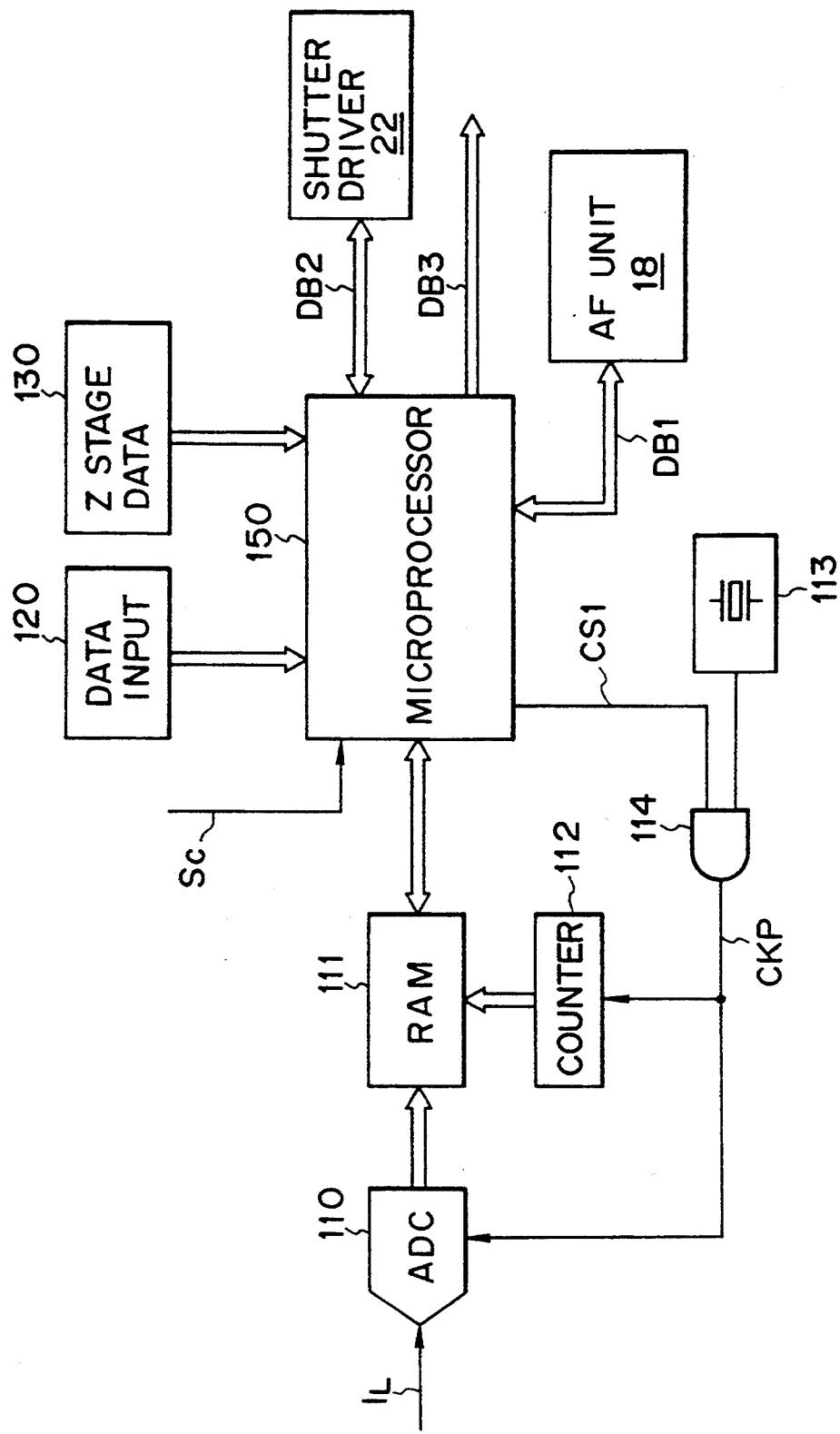
FIG. 5 is a block diagram showing the construction of the main control system in FIG. 4.

In FIG. 5, an analog-digital converter ADC 110 receives as an input the amplified photoelectric signal IL from the photoelectric sensor 20, and converts the level of the signal IL into a digital value during each predetermined sampling time. The converted digital value is stored in a memory (RAM) 111 in order of address. The address value of the RAM 111 is generated by a counter 112, and this counter 112 counts the pulse number of a Clock pulse CKP made by a clock generator 113 only while the clock pulse CKP passes through a gate 114. The opening and closing of the gate 114 are changed over by a signal $CS_1$ from a microprocessor (μP) 150.

This microprocessor μP 150 is connected to both of the AF unit 18 and the shutter driver 22 in FIG. 4 through bus lines $DB_1$ and $DB_2$, and effects the exchange of data necessary for control. A data input portion (or a man machine interface) 120 receives as inputs commands and data from the operator, and main commands are a changeover command for multiplex exposure or nominal exposure and an exposure starting command, and main data are the proper (target) exposure amount per shot and the movement width ($2Z_1$) of the Z stage 14 during multiplex exposure. A Z stage characteristic data portion 130 stores therein chiefly the data of the movement speed characteristic of the Z stage 14 (the maximum speed value, the acceleration value, etc.). The data of this speed characteristic can be easily found by converting the output value from the tachogenerator provided in the driving portion 15 for the Z stage 14 into a digital value by an A/D converter during each predetermined sampling time, and reading the digital value into the memory in the microprocessor μP 150 through the bus line $DB_1$, and thereafter analyzing it by the microprocessor μP 150. The data thus found by the microprocessor μP are stored in the Z stage characteristic data portion 130, but the Z stage may sometimes differ in its speed characteristic between a case where it is moved from below to above and a case where it is moved from above to below and therefore, it is preferable to find and store speed characteristics with respect to the both cases.

The microprocessor μP 150 controls the stoppage of the outputting of the signal $CS_1$ to the gate 114 on the basis of the inputting of the closing signal Sc of the shutter 3. Further, the microprocessor μP 150 outputs various warnings to the operator through a bus line $DB_3$. As one of the warnings, it is reported that it is difficult to effect multiplex exposure under exposure conditions input to the data input portion 120 and accordingly, it is necessary to revise some of the conditions.

The basic operation of the present embodiment will now be described.

Let it be assumed that the shutter 3 in FIG. 4 is in its closed state, the lamp control unit 23 is set to the normal exposure system, and the integrated value of the quantity of light in the integrator circuit 21 is reset to zero.

Prior to exposure, the microprocessor μP 150 sets the value of the proper exposure amount input to the data input portion 120 in one input of the comparison circuit of the integrator circuit 21 and also outputs an opening command for the shutter 3 to the shutter driver 22 through the bus line $DB_2$ in the one-time exposure mode with the wafer W being absent under the projection lens PL. Thereby, the shutter driver 22 controls the closing of the shutter 3 so that the exposure amount on the reticle R or the wafer W may be a proper value. At this time, the microprocessor μP 150 delivers the signal $CS_1$ to the gate 114 simultaneously with the generation of the opening command for the shutter, and starts the counting up by the counter 112. The counting up by the counter 112 is stopped by the outputting of the signal $CS_1$ being discontinued in a predetermined time after the shutter closing signal Sc is produced. That predetermined time is made somewhat longer than the operational delay (electrical and mechanical delay) during the closing of the shutter.

Figure 6:
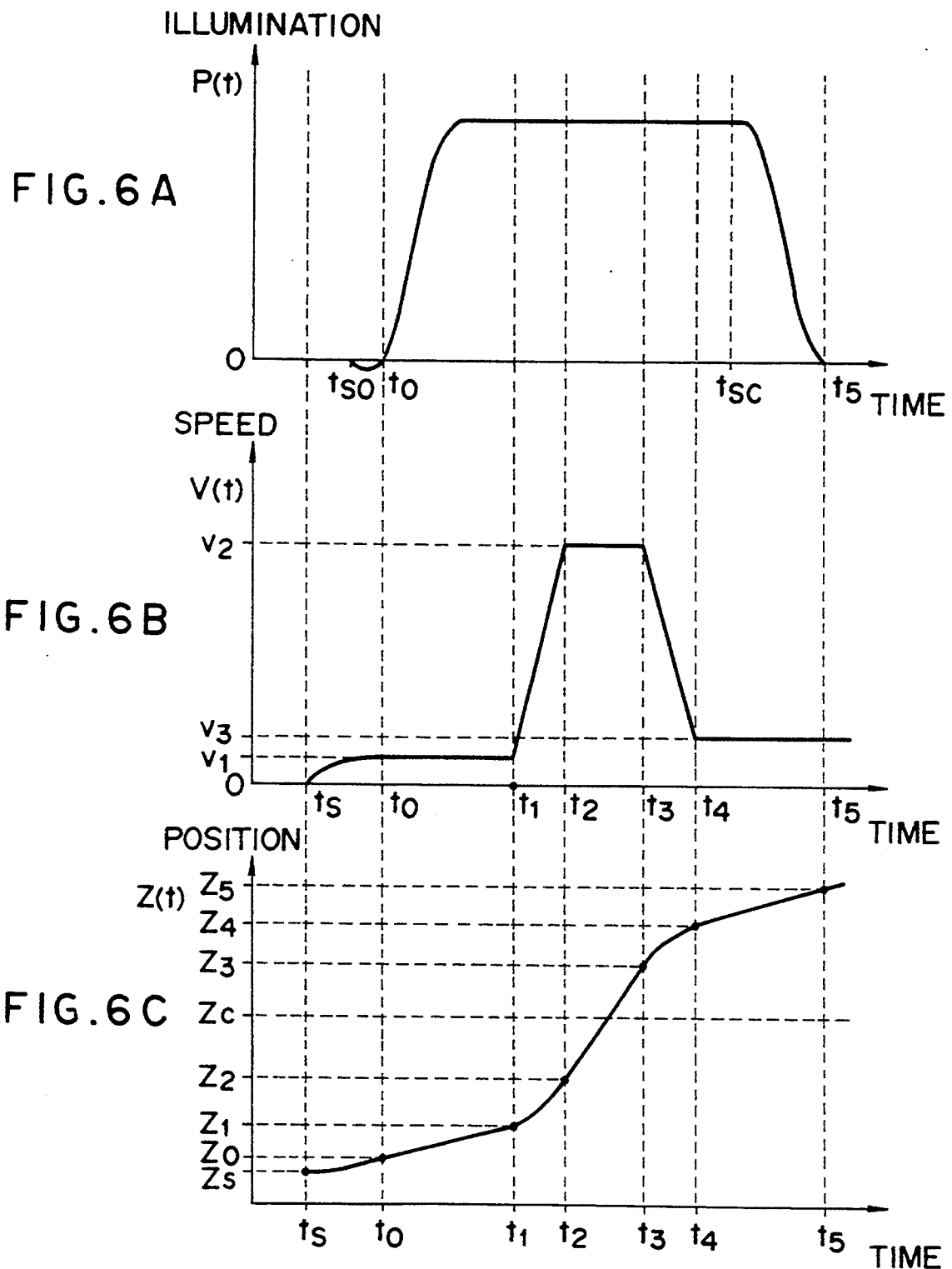
FIGS. 6A–6C are graphs showing an example of the illumination variation characteristic resulting from the opening-closing of a shutter and the driving characteristic of the Z stage.

When in this manner, dummy exposure is effected in the one-time exposure mode under conditions under which proper exposure is obtained for a predetermined wafer, an illumination variation characteristic P (t) on the reticle is obtained in the RAM 111 in FIG. 5 as shown, for example, in FIG. 6A.

The ordinate of this characteristic P (t) represents the illumination value, and the absciss- a represents time and it is to be understood that, at a time $t_{SO}$, the signal $CS_1$ in FIG. 5 is produced and the counting up by the counter 112 is started. Also, a time $t_{SC}$ in FIG. 6A represents a point of time at which the shutter closing signal Sc is produced from the integrator circuit 21.

Further, a time $t_0$ on the characteristic P(t) represents a point of time at which the illuminating light passed through the shutter 3 actually begins to be applied to the reticle R, and has a substantially constant delay with respect to the time $t_{SO}$ when the signal $CS_1$ which is an exposure starting command is produced. Likewise, the time $t_5$ when the applications of the exposure light to the reticle R is completely discontinued has a substantially constant delay with respect to the time $t_{SC}$ when the signal Sc is produced.

As is apparent from FIG. 6A, the total exposure amount (proper exposure amount) Eu provided to the wafer W is expressed as follows with k as a constant:

$$Eu = k \int_{t_0}^{t_5} P(t) \cdot dt \qquad (1)$$

It is because the operational speeds of the shutter 3, the motor 4, the driver 22, etc. are finite that the characteristic P(t) of FIG. 6A does not become rectangular with respect to time. However, the reproducibility of the characteristic P(t) is sufficiently good, and during multitime exposure (during the opening and closing of the shutter), the relation of the characteristic P(t) is reproduced substantially completely.

The microprocessor μP 150 shown in FIG. 5 calculates delay times ($t_0-t_{SO}$) and ($t_5-t_{SC}$) in the characteristic P(t) and the acceleration of the variation in illumination from the shutter opening operation starting time $t_0$ till the shutter closing completion time $t_5$, on the basis of the data stored in the RAM 111, and stores them in the memory in the microprocessor μP 150.

Now, FIG. 6B shows an example of the characteristic V(t) when during the exposure operation, the Z stage 14 is moved at a special speed pattern in the direction of the optic axis on the basis of the speed data stored in the Z stage characteristic data portion 130. Here, the Z stage 14 begins to be moved at a low speed $v_1$ at a time $t_S$ before the time $t_0$ when the shutter opening command is generated, and keeps the speed $v_1$ from the time $t_0$ till a time $t_1$ which is a predetermined time after the time $t_0$, and accelerates to a speed $v_2$ approximate to the highest speed from after the time $t_1$. Then, the Z stage decelerates again to a low speed $v_3$ (substantially equal to $v_1$) from after a time $t_3$ after the Z stage is stabilized at the speed $v_2$, and is maintained at the speed $v_3$ until the closing of the shutter is completed.

FIG. 6C shows the position characteristic Z(t) of the Z stage 14 in the direction of the optic axis when the Z stage 14 is moved at the characteristic V(t) of FIG. 6B. In FIG. 6C, a position ZC is a position at which the pattern projection image of the reticle R coincides with the surface of the wafer as the best image.

In the present embodiment, the speed of the Z stage 14 is brought into the highest state near the position at which the best image plane coincides with the surface of the wafer, and is kept at the lowest possible speed during the opening and closing operations of the shutter 3. That is, during one shutter opening operation, the Z stage 14 is moved while being accelerated and decelerated at a predetermined characteristic.

Therefore, it is necessary that driving conditions such as the acceleration condition and the deceleration condition of the Z stage 14 be determined before exposure is started.

Now, of course, the step of introducing the illumination characteristic P(t) into the RAM 111 and calculating various data may be suitably executed plural times and the result may be averaged. Also, in the previous example, the opening-closing of the shutter 3 is controlled so that a proper exposure amount may be obtained from first by the integrator circuit 21, but in the case of a mode in which the opening-closing of the shutter 3 is controlled by time, the set shutter time can be adjusted until a proper exposure amount is obtained, and after the proper exposure amount is obtained, the characteristic P(t) of FIG. 6A can be stored in the RAM 111. In order to confirm whether proper exposure is obtained on the wafer surface side (the image side of the projection lens PL), use may also be made of a photoelectric sensor 19 provided on the XY stage 13. Further, the characteristic P (t) to be stored in the RAM 111 may be made from the photoelectric signal of the photoelectric sensor 19 obtained through a processing system 24.

Description will now be made of a method of determining the movement conditions of the Z stage 14 in the present embodiment. Supposing the actual exposure operation, the wafer W is at a position Zs before the exposure is started, and the wafer W starts movement in the Z direction (the direction of the optic axis) from here. Now, as shown in FIGS. 6A–6C, the Z stage 14 at the position Zs starts to be driven at a time $t_s$, and is uniformly moved at a low speed $v_1$. The shutter opening command (signal $CS_1$) is output at a time $t_{SO}$ so that the shutter 3 may begin to be opened after the speed of the Z stage 14 is stabilized at $v_1$. Thereupon, at a time $t_0$, exposure to the wafer W is started and at that time, the Z stage 14 has arrived at a position $Z_0$. The uniform movement at the speed $v_1$ is continued until a time $t_1$, i.e., until the position of the wafer W in the Z direction comes to an acceleration position $Z_1$, whereafter the Z stage 14 is again accelerated at an acceleration a and at a time $t_2$, it reaches a speed $v_2$ (the substantially highest speed). Accordingly, the acceleration a is expressed as follows:

$$a=(v_2-v_1)/(t_2-t_1) \qquad (2)$$

Also, the positions of the Z stage 14 at the times $t_1$ and $t_2$ are $Z_1$ and $Z_2$. From the time $t_2$ till a time $t_3$, the Z stage is uniformly moved at the speed $v_2$ and on its way, the Z stage passes through the best focus position ZC for the wafer W. When at the time $t_3$, the Z stage comes to a position $Z_3$, the Z stage is decelerated at an acceleration β, and at a time $t_4$ (a position $Z_4$), it is dropped to a low speed $v_3$. At this time, the acceleration β (β<0) is expressed as follows:

$$\beta=(v_3-v_2)/(t_4-t_3) \qquad (3)$$

From the time $t_4$ till a time $t_5$ (from the position $Z_4$ to a position $Z_5$), the wafer W is uniformly moved at the speed $v_3$, and at a time $t_{SC}$, the shutter closing command (signal Sc) is output.

In the present embodiment, exposure amounts $E_1$ and $E_4$ provided to the wafer W at the positions $Z_0$, $Z_1$, $Z_4$ and $Z_5$ and between the positions $Z_0$-$Z_1$ and between the positions $Z_4$-$Z_5$ greatly contribute to the enlargement of the depth of focus.

The estimation of these exposure amounts $E_1$ and $E_4$ is pre-calculated by the microprocessor μP 150 in FIG. 5, and in this calculation, conditions may be automatically determined by the use of the amount of depth of focus (±DOF) of the projection lens PL itself and the proper exposure amount (total exposure amount) Eu input from the data input portion 120, but an operation processed under conditions uniquely set by the operator is also regarded as possible.

Now, the conditions are automatically determined as an example as follows by the microprocessor μP 150:

$$Z_0 = +DOF, \; Z_1 = +0.8 \times DOF$$

$$Z_5 = -DOF, \; Z_4 = -0.8 \times DOF$$

$$E_1 = 0.35 \times Eu, \; E_4 = 0.35 \times Eu$$

As is clear from this, the exposure amount provided to the wafer W while the Z stage 14 is moved from the position $Z_1$ to the position $Z_4$ is about 30% of the total exposure amount Eu.

The numerical values (parameters) shown above by way of example are standard values to the last, and can be suitably changed by the operator. However, if the parameters are changed at random, it does not always follow from various limitations (such as the speed and movement stroke of the Z stage and the illumination) that the conditions are properly set. In that case, as will be described later in detail, a warning is generated through the bus line $DB_3$ to inform the operation that the proper setting of the conditions is impossible by the parameters changed by the operator.

Now, when the exposure amount $E_1$ is determined in accordance with the above-described parameters, the time $t_1$ when the exposure amount integrated from the exposure starting time $t_0$ (the integrated value) becomes $E_1$ can be found from the relation of the following equation (in which $k_1$ is a constant), on the basis of the illumination variation characteristic $P(t)$ stored in the RAM 111:

$$E_1 = \int_{t_0}^{t_1} k_1 \cdot P(t)dt \tag{4}$$

When the time $t_1$ is thus found, the speed $v_1$ at which the Z stage is to be moved from the position $Z_0$ to the position $Z_1$ at the time $(t_1-t_0)$ can be found from the following equation:

$$v_1 = (Z_1 - Z_0)/(t_1 - t_0) \tag{5}$$

Here, the spacing between the positions $Z_0$ and $Z_1$ may preferably be as small as possible relative to the depth of focus DOF ($ZC-Z_0$, $Z_5-ZC$) of the projection lens PL, and as an example, may desirably be ⅓ or less of the value DOF.

When the exposure amount $E_4$ is determined in a similar manner, the time $t_4$ when the exposure amount (integrated value) provided to the wafer W from the time $t_4$ till the time $t_5$ becomes $E_4$ is inversely calculated from the relation of the following equation (in which $k_2$ is a constant) on the basis of the illumination variation characteristic $P(t)$:

$$E_4 = \int_{t_4}^{t_5} k_2 \cdot P(t)dt \tag{6}$$

Here, the time $t_5$ is known, and is already prescribed on the characteristic $P(t)$ stored in the RAM 111.

When the time $t_4$ is thus found, the speed $v_3$ at which the Z stage is to be moved from the position $Z_4$ to the position $Z_5$ at the time $(t_5-t_4)$ can be found from the following equation:

$$v_3 = (Z_5 - Z_4)/(t_5 - t_4) \tag{7}$$

Here, the spacing between the positions $Z_4$ and $Z_5$ may also desirably be ⅓ or less of the depth of focus DOF of the projection lens PL. By the above-described calculations, the times $t_0-t_1$, the times $t_4-t_5$ and the speeds $v_1$ and $v_3$ are determined.

From what has been described above, it will be seen that when the total exposure time $(t_5-t_0)$ is Tt, the movement of the Z stage 14 from the position $Z_1$ to the position $Z_4$ (the acceleration and deceleration range from the time $t_1$ till the time $t_4$) should be effected during $$Tt - (t_1 - t_0) - (t_5 - t_4) = T\alpha\beta \tag{8}$$

At this time, from the acceleration and deceleration characteristics of the Z stage 14, the time $(t_2-t_1)$ and the time $(t_4-t_3)$ are substantially constant values and thus, when the total of the time $(t_2-t_1)$ and the time $(t_4-t_3)$ becomes greater than the time $T\alpha\beta$, the control of the Z stage becomes unstable and the expected depth enlarging effect cannot be attained.

When it is confirmed that $(t_2-t_1)+(t_4-t_3) \leq T\alpha\beta$, the microprocessor μP 150 finds the relation among the acceleration discontinuing time $t_2$ and the deceleration starting time $t_3$ of the Z stage 14 and the speed $v_2$. Here, the distance from the position $Z_1$ to the position $Z_4$ is represented by the following equation:

$$Z_4 - Z_1 = \tfrac{1}{2} \cdot a(t_2 - t_1)^2 + v_1(t_2 - t_1) + \\ v_2(t_3 - t_2) + v_3(t_4 - t_3) - \tfrac{1}{2} \cdot \beta(t_4 - t_3)^2 \tag{9}$$

Further, the accelerations a and β are known from equations (2) and (3) and therefore, this equation (9) can be rewritten as follows:

$$Z_4 - Z_1 = \tfrac{1}{2} \cdot v_1(t_2 - t_1) + \\ \tfrac{1}{2} \cdot v_2(t_4 + t_3 - t_2 - t_1) + \tfrac{1}{2} \cdot v_3(t_4 - t_3) \tag{10}$$

In this equation (10), the times $t_1$ and $t_4$ and the speeds $v_1$ and $v_3$ have all been previously determined and therefore, equation (10) becomes a relational expression having $v_2$, $t_2$ and $t_3$ as parameters.

Accordingly, if the speed $v_2$ and the time $t_2$ are suitably determined, the time $t_3$ will be correspondingly determined and the positions and the driving conditions of the Z stage at the respective times during exposure $(t_0-t_5)$ will be accurately determined.

In the case of the present embodiment, the best focus position ZC lies substantially at the midpoint between the positions $Z_1$ and $Z_4$ and therefore, as shown in FIG. 6C, the position characteristic $Z(t)$ becomes a curve substantially point-symmetrical about the position ZC.

Also, in determining the driving conditions of the Z stage 14, the accelerations a and $\beta$ of the Z stage may be fixed at predetermined values in advance on the basis of equations (9), (2) and (3) and the times $t_2$ and $t_4$ may be determined in conformity with the value of the speed $v_2$ from equations (2) and (3), whereby the driving conditions can likewise be found accurately.

Since in the manner described above, the movement conditions including the movement speed of the wafer W in the Z direction during exposure and the Z position are determined, exposure may thereafter be effected in accordance with the determined conditions, whereby between the positions $Z_0$ to $Z_1$, the exposure amount $E_1$ is accurately provided to the wafer W, and between the positions $Z_4$ to $Z_5$, the exposure amount $E_4$ is accurately provided to the wafer W. At the same time, the total exposure amount Eu is also controlled accurately. Also, if the acceleration a between the times $t_1$ to $t_2$ and the acceleration $\beta$ between the times $t_3$ to $t_4$ are controlled to $a = -\beta$, the existence probability of the wafer at the positions $Z_1$ to $Z_4$ with respect to the Z direction will become $ZC \simeq (Z_1 + Z_4)/2$ substantially-symmetrically about the best focus position ZC, and this will greatly contribute to the effect of enlarging the depth of focus.

The initial position of the Z stage 14 has been shown as $Z_5$ but alternatively, the initial position may be a position above $Z_5$ and with the progress of exposure, the Z stage may be moved reversely to $Z_4, Z_3, \ldots, Z_0$.

Also, the Z position of the Z stage during exposure can be detected by the AF unit 18 shown in FIG. 4, but if the movement width (2-DOF) of the Z stage during exposure is great, the Z position may exceed the detection range of the AF sensor. In such case, the focus signal cannot be obtained near the positions $Z_1$ and $Z_4$ and therefore, design can be made such that the positional information is obtained from a potentiometer or a position sensor which monitors the amount of driving of the Z stage. In connection with this, for example, the time when at the best focus position ZC, the focus signal assumes a state representative of in-focus (for example, the zero point) is checked up while the level of the surface of the wafer W is being monitored by an AF sensor, and whether this time is substantially at the midpoint between the times $t_2$ and $t_3$ is judged, whereby whether the exposure operation for one shot has been effected well can be roughly known.

Figure 7:
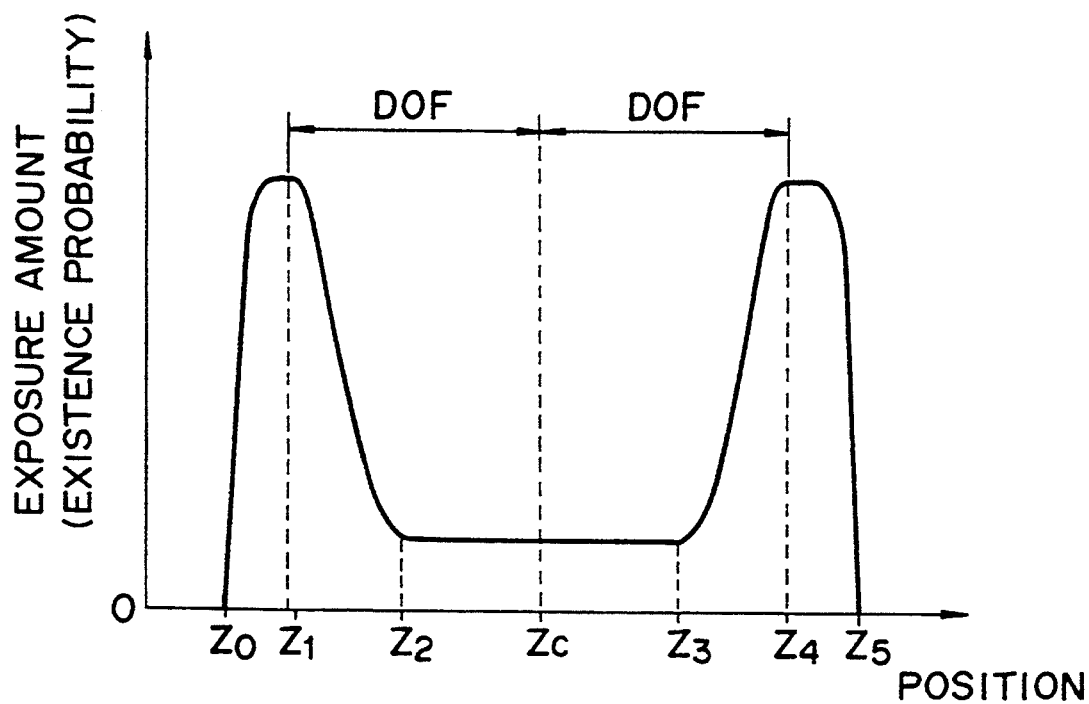
FIG. 7 is a graph showing the distribution of existence probability in Z direction (the direction of the optic axis) obtained under the movement conditions of FIG. 6.

Now, FIG. 7 graphically shows the existence probability of the wafer (or, concentricity of the exposure amount) with respect to the Z direction when exposure is effected at the characteristics shown in FIGS. 6A, 6B and 6C. From the fact that the peaks of the existence probability exist near the positions $Z_0 - Z_1$ and near the positions $Z_4 - Z_5$, the enlargement of the depth of focus can be achieved. In the present embodiment, the exposure amount cannot be made zero at the positions between the peaks, e.g. $Z_2 - Z_3$. This is because the Z stage is continuously moved. To most enhance the effect of enlarging the depth of focus, it is necessary that the existence probability shown in FIG. 7 is provided and the exposure amount $(E_1)$ at the positions $Z_0 - Z_2$ and the exposure amount $(E_4)$ at the positions $Z_3 - Z_5$ be made substantially equal to each other, but in the present embodiment, the speed characteristic V(t) and the position characteristic Z(t) of the Z stage and the illumination characteristic P(t) during the opening-closing of the shutter are strictly controlled and therefore, the control accuracy of the exposure amount is maintained good.

Figure 8:
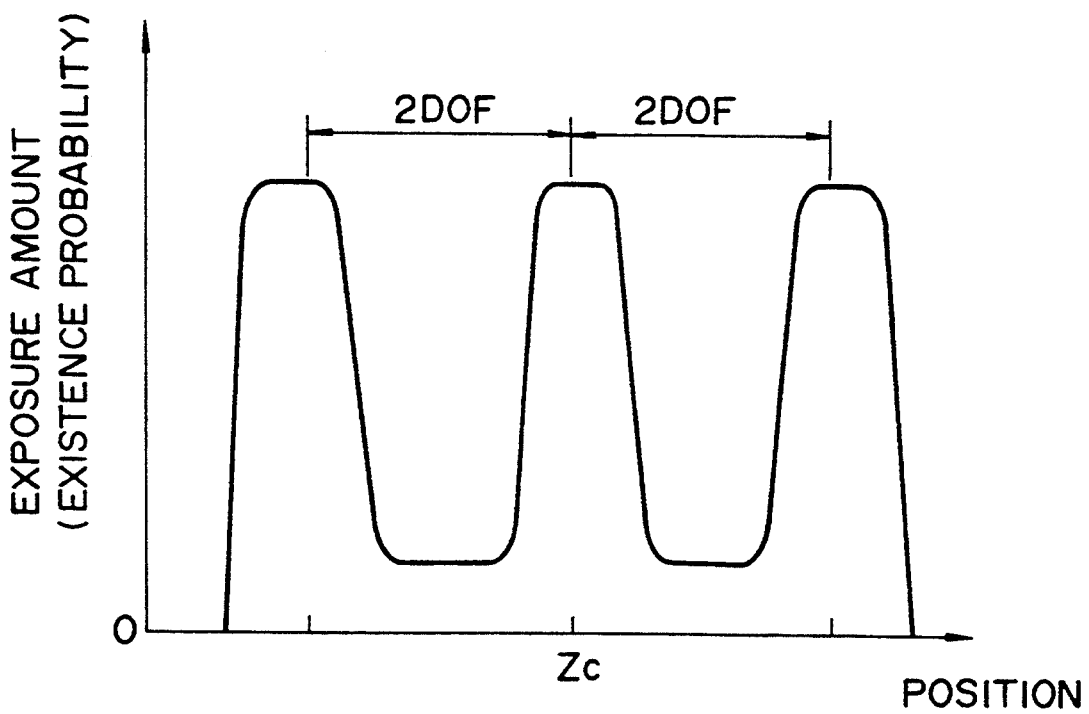
FIG. 8 is a graph showing the distribution when the exposure amount is concentrated in three locations in Z direction.

FIG. 8 shows the existence probability of the wafer when the number of times of multiplex exposure is three, and represents a case where as the driving pattern of the Z stage 14 when the shutter is open, the low speed uniform movement→acceleration and deceleration→the low speed uniform movement are repeated twice. Peaks exist at three locations with respect to the position in the Z direction, and the central peak is adjusted to the best focus position ZC, and the peaks on the opposite sides of the central peak are spaced apart from each other by an amount corresponding to the depth-of-focus width 2·DOF of the projection lens PL. Again in this case, it is more desirable that the exposure amounts corresponding to the three peaks be uniform.

As described above, in the present embodiment, the characteristic P(t) of FIG. 6A is proportionally enlarged in the direction of the time axis with the deterioration of the lamp intensity and therefore, after one lot of wafers (25 wafers) have been treated, the characteristic P(t) should preferably be re-measured. Also, after the characteristic P(t) has been stored in the RAM 111, it is better to adopt a timer mode in which the operation of the shutter 3 is controlled by time, and control the time $t_{so} - t_{sc}$ so as to be set as the shutter time.

A second embodiment of the present invention will now be described.

In the second embodiment, when it is known on the basis of a warning signal obtained through the bus line $DB_3$ of the microprocessor $\mu P$ 150 that multiplex exposure becomes incomplete in the calculation process, there is given the function of relieving it. Description will first be made of a state in which the warning signal may be produced.

In most cases, the warning is produced when the time from the opening start time $t_0$ of the shutter 3 till the closing completion time $t_5$ of the shutter 3 becomes considerably short as compared with the movement speed variation pattern of the Z stage 14. For example, when from the limit of the driving characteristic of the Z stage 14, the time $t_1 - t_4$ becomes so short that the constant high speed range (speed $v_2$) as shown in 6B does not exist, the range in which a minimum existence probability is provided between the positions $Z_2 - Z_3$ as shown in FIG. 7 becomes null and the effect of enlarging the depth of focus cannot sufficiently obtained.

Accordingly, at a point of time whereat it is found in the calculation process that good control is impossible, the actual exposure time $(t_0 - t_5)$ for the wafer W can be lengthened until good control becomes possible.

In the present embodiment, the exposure time per one shot becomes slightly longer and some reduction in throughput is caused, but the reduction in throughput heretofore experienced can be avoided. For that purpose, an ND filter for stepwisely changing the intensity of the illuminating light is removably provided in the illuminating optical system of the projection exposure apparatus. As regards the transmittance of the ND filter, light may be decreased, for example, at every 10% and finally to the order of 50%.

As another means, it would occur to mind to reduce the supplied electric power to the lamp 1 through the lamp control unit 23 shown in FIG. 4. In such case, the supplied electric power must be reduced within such a range that the lamp 1 continues to be stably turned on.

In any case, in a state in which after the intensity of the illuminating light is reduced by a predetermined amount, the opening-closing of the shutter 3 is again effected so that a proper exposure amount may be obtained, the illumination characteristic P(t) can be again stored in the RAM 111 and similar calculation can be executed.

While each embodiment has been described with respect to an example in which the wafer W is moved in the direction of the optic axis, a similar effect will be obtained by a construction in which a chose air chamber in the projection lens PL is hermetically sealed and the pressure in the air chamber is forcibly adjusted, whereby the focus position of the projection lens PL itself (the surface conjugate with the reticle) is moved in the direction of the optic axis. Also, in the case of a both-side telecentric projection lens, even if a construction is adopted in which one or more lens elements positioned on the reticle side are finely moved by a piezo element or the like, the projected image (the best focus plane) can be parallel-shifted in the direction of the optic axis.

Next, an example of optimum control at the time when projection exposure is effected with respect to a contact hole pattern will be explained as a third embodiment of the invention. In this embodiment exposure amount in the direction of the optic axis is concentrated in the same way as that of the foregoing embodiments.

Figure 9:
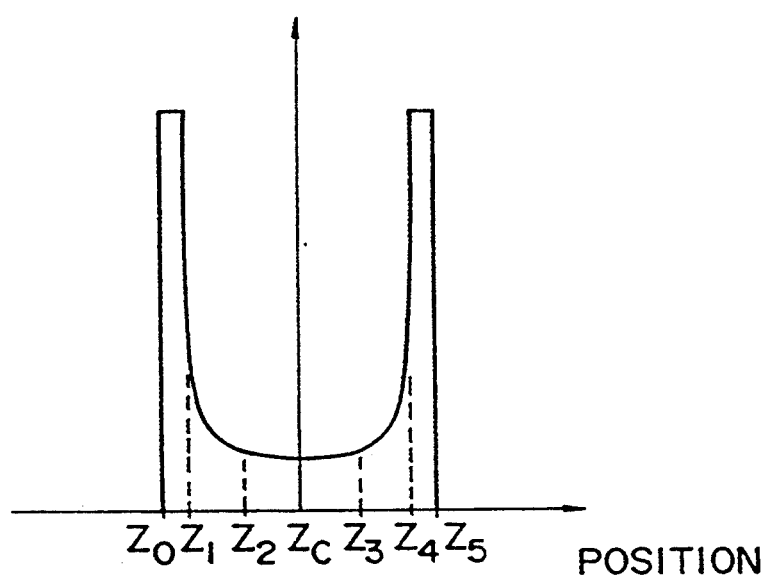
FIG. 9 is a graph showing the simulated distribution of existence probability.

FIG. 9 shows the characteristic of the existence probability simulated on the basis of the position characteristic Z(t) of the Z stage and is the same one as shown in FIG. 7. In FIG. 9, the existence probability from times $t_0$ to $t_5$ is shown, and the existence probability is constant in the low speed uniform movement ranges from times $t_0$ to $t_1$ and from times $t_4$ to $t_5$. For simplifying the explanation below, changes in illumination at the rise and the fall of the illumination characteristic P(t) are neglected, and it is assumed that the illumination is constant over time interval from $t_0$ to $t_5$ (where the shutter is fully opened).

Generally, the existence probability is defined as time $\Delta t$ required for unit displacement $\Delta Z$ in the Z direction, and is treated as $\Delta t/\Delta Z$.

Figure 10:
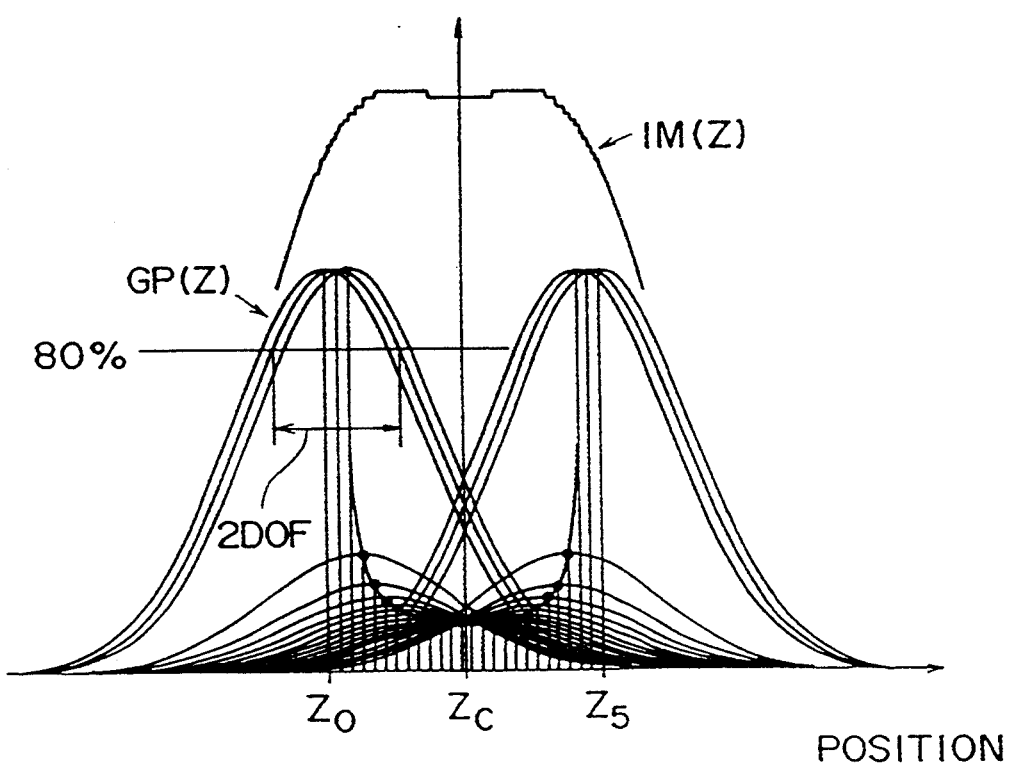
FIG. 10 is a diagram showing the condition to simulate the distribution of light amount of a contact hole image.

In the case where exposure is effected with respect to the projection image of the contact hole pattern under distribution of such existence probability, the intensity distribution in the optic axis in the center of the projection image or in the neighborhood thereof of one contact hole pattern may be considered to take approximately a Gaussian distribution because the size of the pattern is close to the resolution limit of the projection lens. FIG. 10 is the result of simulation on the distribution of the quantity of light by the contact hole image in the direction of the optic axis.

The distribution of the quantity of light in the direction of the optic axis (in the Z direction) may be obtained by convolution of the product of the existence probability characteristic (function) shown FIG. 9 and the function of the Gaussian distribution. In the case of simulation by a computer, Gaussian distribution curve GP(Z) is so shifted in the Z direction along the curve of the existence probability that the peak of the curve GP(Z) at each point in the Z direction may be located on the curve of the existence probability, and the Gaussian distribution curves thus obtained are summed to obtain the light quantity distribution IM(Z).

The width in the Z direction at a level where the intensity of one Gaussian distribution GP(Z) is about 80% of the peak value, corresponds to the effective "depth of focus" width 2·DOF of the projection lens. From the simulation shown in FIG. 10, the light guantity distribution IM(Z) is substantially flat in the movement range on width from $Z_0$ to $Z_5$ of the Z stage. This means that, when the projection image plane is set to a position ZC and the surface of the wafer is shifted between the positions $Z_0$ and $Z_5$, the quantity of light of the contact hole image applied to the resist layer is substantially constant. In other words, the fact that the quantity of light (the contact hole image) is substantially constant over the long range in the direction of the optic axis, means that the apparent depth of focus is made larger to that extent.

Meanwhile, in the simulation of FIG. 10, the ratio (Z-Span/2·DOF) of the movement range Z-span of the Z stage from the position $Z_0$ to the position $Z_5$ to the "depth of focus" width 2·DOF of the single unit of the projection lens is about 2.24. This is because, during exposure operation from the position $Z_0$ to the position $Z_5$, the shutter is fully opened and the illumination is constant, and actually the ratio is slightly smaller.

From the simulation the optimum value of the movement range of the Z stage can be obtained. If the ratio Z-Span/2·DOF is made smaller from the stage shown in FIG. 10, the light quantity distribution IM(Z) rapidly changes to form a Gaussian distribution peaked at the position ZC. If the ratio Z-Span/2·DOF is made larger, the light quantity distribution IM(Z) falls at the position ZC and has the peaks between the position $Z_0$ and ZC and between the positions ZC and $Z_5$. According to the experiments, it has been formed that, in the case of the contact hole pattern, if the movement range of the Z stage is so determined that the light quantity distribution is substantially flat, the apparent depth of focus is sufficiently extended and further the deterioration of contrast is made minimum.

In the third embodiment, a software for carrying out the simulation as shown in FIG. 10 is provided in the stepper, by which the existence probability chacteristic curve is produced based on various parameters under the exposure condition designated by user and the Gaussian distribution GP(Z) is shifted in the Z direction along the existence probability curve, thereby calculating the quantity distribution IM(Z) of the contact hole pattern, where the peak of each Gaussian distribution is made coincident with the curve of the existence probability when the shutter is in the fully opened state, while during the opening operation or closing operation of the shutter the peak of each Gaussian distribution is adjusted to be on a point lowered from the value of the existence probability to the extent of the lowered amount from the illumination obtained at the time when the shutter is fully opened.

The thus obtained light quantity distribution IM(Z) is displayed by a cathode-ray tube or the like on the control panel of the stepper, and the width in the Z direction of the flat portion which is within the tolerance range is calculated and displayed. This is advantageous because the operator can confirm previously whether the optimum result is expected under the set exposure condition, and that resetting of another exposure condition can be easily made.

In addition to warning or anouncing as described with respect to the second embodiment, anouncing to the operator may be made to notice that there is any problem on exposure condition in view of the characteristic of the light quantity distribution IM(Z) obtained by the simulation.

Meanwhile, the substantially constant light quantity distribution in the Z direction as shown in FIG. 10 is particularly advantageous in the case where the wafer surface has continuous unevenness since the pattern is formed accurately with respect to each of uneven or stepped portions on the wafer surface.

In the case where steps or uneven portions are located mainly at the memory cell portion and the peripheral circuit portions as in the case of DRAM pattern, it is not necessary to make the light quantity distribution of the contact hole image constant in the Z direction, but rather it may be so set that the light quantity distribution is larger at two portions, the higher portion (memory call portion) and the lower portion (peripheral circuit) of the stepped portions. For this purpose, the movement range Z-Span of the Z stage may be extendned.

As described above, according to the present invention, during one exposure time (one shutter opening operation), the projection image plane and the photosensitive substrate are moved relative to each other in the direction of the optic axis at a pre-controlled speed characteristic and therefore, the effect of enlarging the depth of focus can be attained without extremely reducing the photosensitive substrate treating ability (throughput) per unit time. Also, the illumination variation characteristic of the illuminating light on the mask is found in advance before the main exposure to the photosensitive substrate and therefore, the desired exposure amounts ($E_1$, $E_4$, etc.) input by the operator can be exactly concentrated on particular points (two or three points) within the focus range set by the operator and at the same time, the total exposure amount for one shot area can also be accurately controlled.

A fourth embodiment of the present invention will now be described.

In this embodiment, as in the previous embodiments, it is a premise that provision is made of a projection optical system PL for projecting the pattern of the reticle R onto a predetermined area (a shot area) on the wafer W, an XY stage 13 for two-dimensionally moving the wafer W in a plane perpendicular to the optic axis AX of the projection optical system, spacing changing means (the Z stage 14, the driving portion 15, etc.) for continuously changing the relative spacing between the imaging plane (the best focus plane) of the projection optical system and the wafer W in the direction of the optic axis, and control means (MCU 18D) for operating the spacing changing means in operative association with the exposing operation of giving a proper exposure amount to a certain predetermined area.

This embodiment is characterized by the provision of state detecting means (steps 208, 210, 212 and 213 by CPU 300) for detecting the state of the coordination (the timing in terms of time) of the operation of the spacing changing means and the exposing operation when a predetermined area to be precedently exposed is exposed under a preset operational condition, and modifying means (steps 214 and 215 by CPU 300) for modifying a parameter which prescribes the operational conditions (the start timing, speed, etc. of the Z stage) of the control means (MCU 18D) or the condition (the exposure time by the fine adjustment of the intensity of the light source) of the exposing operation for a predetermined area to be next exposed when the detected state is improper.

In the present embodiment, design is made such that when the exposing operation is repetitively performed substantially under the same condition, the coordination of the continuous movement of the spacing changing means (the Z stage) during the preceding exposing operation is analyzed (learned) to thereby find an error in the coordination and the parameter is modified so that the error may be corrected during the succeeding exposing operation.

In the present embodiment, design is also made such that for example, the period during which the Z stage is continuously moved in the direction of the optic axis is accurately set within one exposure time, whereby the weights of the exposure amount become substantially equal maximum values at two locations spaced apart from each other in the direction of the optic axis. If this setting is inaccurate, there will arise the problem that the effect of enlarging the depth of focus cannot be sufficiently enhanced or there occurs a difference in the enlarging effect for each shot, but in the present embodiment, for example, the coordination in the shot exposure immediately before is learned and the result of it is reflected in the next shot exposure and therefore, the stable effect of enlarging the depth of focus can be obtained for almost all shots.

Figure 11:
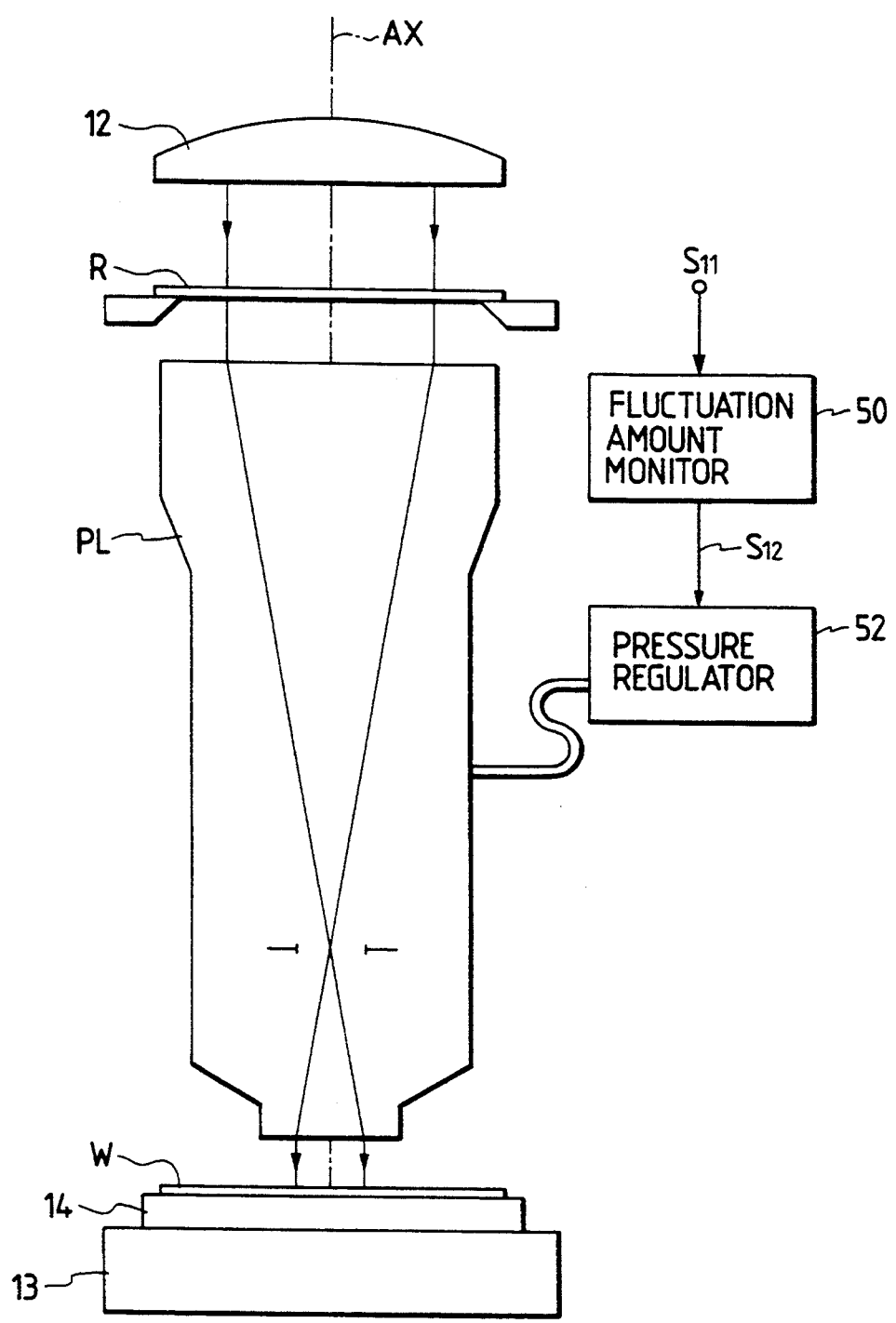
FIG. 11 shows the construction of a projection exposure apparatus which is the premise of a fourth embodiment.

FIG. 11 shows the epitome of a projection exposure apparatus used in the present embodiment, and this apparatus is basically the same as the construction of FIG. 4. The condenser lens 12 constituting the last stage of the illuminating system applies illuminating light of uniform illuminance to the reticle R on which is depicted a circuit pattern for semiconductor printing. The reduction projection lens PL of 1/5 or 1/10 projects and exposes the pattern of the reticle R onto the wafer W under a both-side telecentric condition. A photosensitive layer (photoresist), not shown, is applied to the wafer W, which is adsorbed onto the Z stage 14 including a wafer holder. This Z stage 14 is provided on the XY stage 13 for fine movement in the direction of the optic axis AX of the projection lens PL (Z direction). The Z stage 14 is usually used to align the surface of the wafer W with the right focus plane (the plane of the projection lens PL which is conjugate with the reticle R), and the XY stage 13 is two-dimensionally moved to position the projected image of the reticle R and the wafer W in a plane perpendicular to the optic axis AX. The Z stage 14 is movement-controlled with an accuracy of e.g. 0.1 $\mu$m or less so that the surface of the wafer W can be positioned with higher accuracy within an effective focus range which decreases as the resolving power (numerical aperture N.A.) of the projection lens PL is improved.

Also, it is known that the optical performances of the projection lens PL such as focus position and magnification (distortion) are fluctuated by the atmospheric pressure and temperature under the environment of use and the exposure energy power, the quantity of applied light, etc. during the processing of the wafer. Therefore, in the apparatus of the present embodiment, a fluctuation amount monitor 50 for inputting the information $S_{11}$ of those environmental conditions and exposure conditions and calculating the fluctuation of the optical performances of the projection lens PL and a pressure regulator 52 for regulating the air pressure in the projection lens PL in conformity with the calculated fluctuation amount are provided so as to correct the fluctuation of the optical performances.

Figure 12:
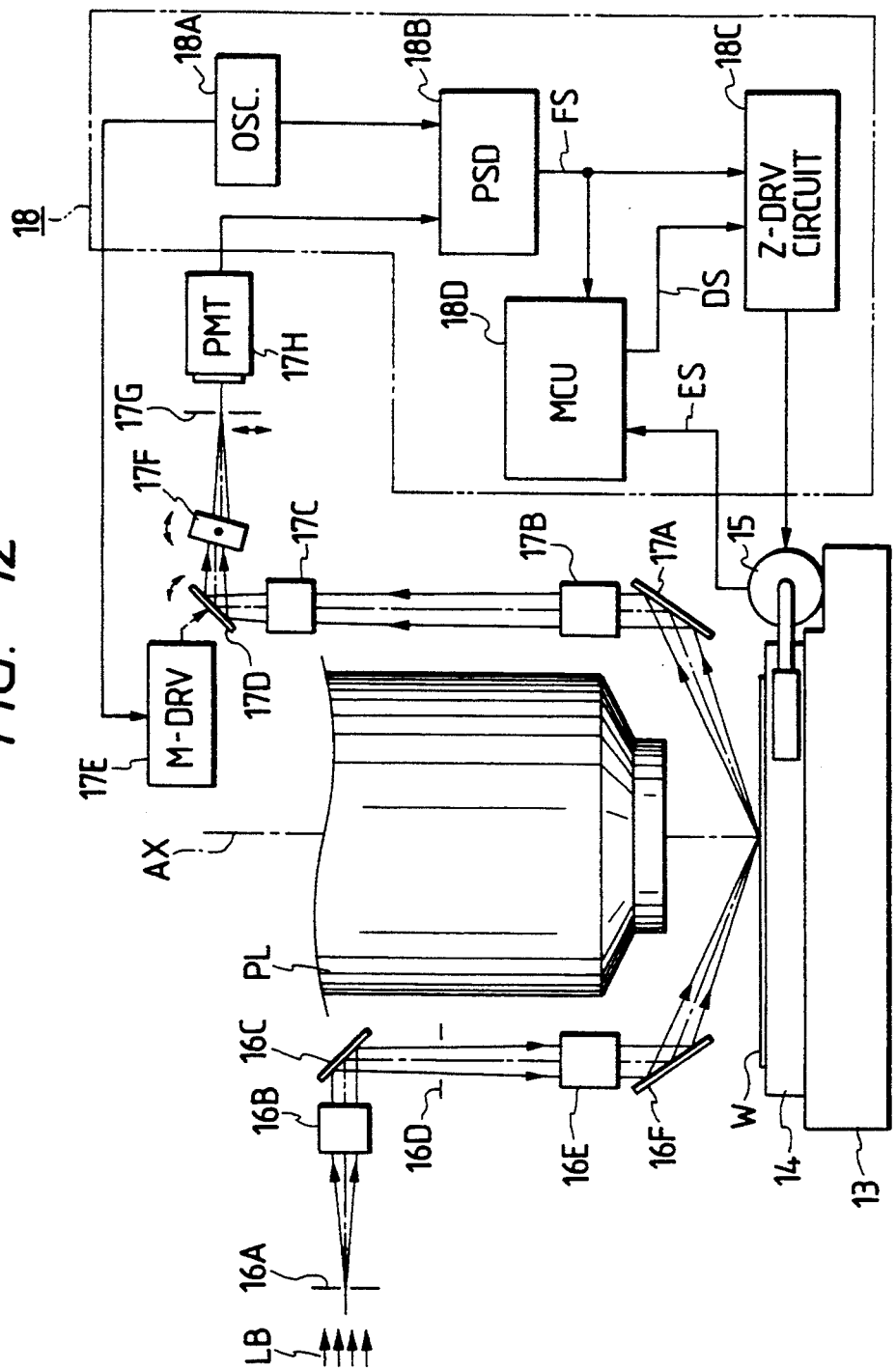
FIG. 12 is a block diagram showing a focus detecting system of the oblique incident light type and a control system for the Z stage.
Figure 13:
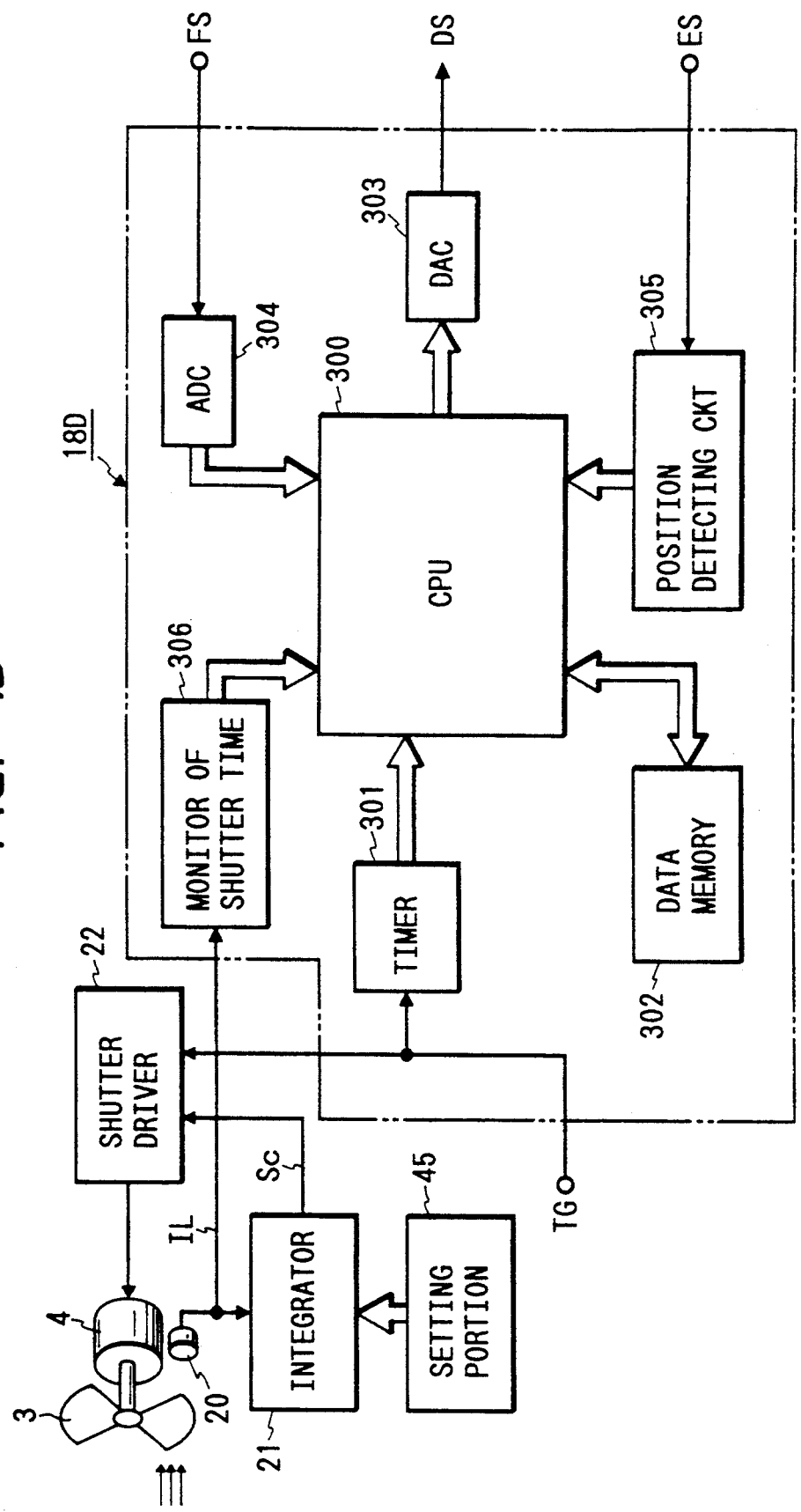
FIG. 13 is a functional block diagram showing the constructions of an exposure control portion and a main control portion.

FIG. 12 shows the details of the construction of an automatic focusing mechanism (16, 17, 18) of the oblique incident light type provided in the projection exposure apparatus shown in FIG. 4, and FIG. 13 is a block diagram collectively showing the mechanisms of the hardware and software of the control system in the apparatus of FIG. 12. The automatic focusing (hereinafter referred to as AF) mechanism will first be described with reference to FIG. 12.

Illuminating light LB non-sensitizing to the resist layer on the wafer W and having a wide wavelength width uniformly illuminates a slit plate 16A. The light passed through a slit in the slit plate 16A becomes an imaging light beam obliquely incident on the wafer W via a lens system 16B, a mirror 16C, a stop 16D, a projection lens 16E and a mirror 16F. Thereby, a one-dimensional slit image is formed at a position on the wafer W through which the optic axis AX of the projection lens PL passes, i.e., the center of the projected area of the pattern image of the reticle R. The above-mentioned members 16A–16F correspond to the light projector 16 of FIG. 4. The reflected light reflected by the wafer W is imaged on a light receiving slit plate 17G via a mirror 17A, an objective lens 17B, a relay lens 17C, a vibration mirror 17D and plane parallel glass 17F. That is, a light transmitting slit plate 16A, the wafer W and the light receiving slit plate 17G are set so as to become conjugate with one another when the wafer W comes to a predetermined position (in-focus position) in the direction of the optic axis. The system from the light transmitting slit plate 16A to the light receiving slit plate 17G is disposed without finely moving relative to the projection lens PL. Assuming here that the wafer W is coincident with the best imaging plane of the projection lens PL (i.e., is in focus), the slit image on the light receiving slit plate 17G vibrates about the slit in the light receiving slit plate 17G due to the action of the vibration mirror 17D. When the wafer W deviates from the in-focus position, the center of vibration of the slit image on the slit plate 17G becomes displaced from the slit in the slit 17G. A photomultiplier (PMT) 17H photoelectrically detects the quantity of light passed through the light receiving slit plate 17G, and the photoelectric signal thereof is output to a phase synchronous demodulator circuit (hereinafter referred to as PSD) 18B. Also, an oscillator (OSC.) 18A outputs an AC drive signal of frequency f to an actuator (M-DRV) 17E for driving the vibration mirror 17D and outputs a reference signal of frequency f to the PSD 18B. The PSD 18B receives as inputs the reference signal from the OSC. 18A and the photoelectric signal from the PMT 17H, and synchronously detects the photoelectric signal relative to the reference signal. In the above-described construction, the members 17A–17H correspond to the light receiving device 17 in FIG. 4.

This synchronous detection is the same as that effected by a well-known photoelectric microscope, and when the center of vibration of the slit image vibrating on the slit plate 17G coincides with the center of the slit in the slit plate 17G, the photoelectric signal of the PMT 17H assumes a frequency (2f) just double the frequency f of the oscillation signal of the OSC. 18A and the detection output FS of the PSD 18B becomes zero. When this state is deviated from, the PSD 18B produces a detection output FS differing in polarity, depending on the direction of the deviation, i.e., in which direction the position of the wafer W has been displaced relative to the in-focus position.

Accordingly, the detection output FS of the PSD 18B exhibits a such a continuous voltage change that it is zero in the in-focus state, becomes positive when the wafer W comes, for example, near the projection lens PL side, and becomes negative when the wafer W goes away from the projection lens PL. The detection output FS is usually called an S curve signal and near the zero point thereof, there exists a range in which the relation between the voltage change and the change in the position of the wafer in Z direction becomes substantially linear, and this range is used for servo control for the movement of the Z stage 14.

Now, the Z stage 14 is moved by a driving portion 15 such as a motor which is provided on the XY stage 13 being servo-controlled by a driving circuit (Z-DRV) 18C. In the usual mode, the Z-DRV 18C receives the detection output FS from the PSD 18B as deviation information, and drives the motor 15 so that the detection output FS may coincide with a target value DS from a main control unit (MCU) 18D. The vibration mirror 17D, M-DRV 17E, the slit plate 17G, the PMT 17H, the OSC. 18A, the PSD 18B, the Z-DRV 18C, the motor 15 and the Z stage 14 together constitute a closed loop control system for automatic focusing. Also, an encoder for detecting the amount of movement of the Z stage 14, or a potentiometer or the like is incorporated in the motor 15 and an information signal ES representative of the amount of movement is output therefrom.

In FIG. 12, the plane parallel glass (hereinafter referred to as the halving glass) 17F in the optical path of the AF system is for inclining the reflected light beam from the wafer W so as to shift in the direction of vibration of the slit image on the slit plate 17G, and acts as an offset mechanism for shifting the surface to be focused by a predetermined amount in the direction of the optic axis AX.

Now, in the present embodiment, as a method of increasing the apparent depth of focus of the projection lens PL, the Z stage 14 is continuously moved in the direction of the optic axis with a predetermined speed characteristic during one exposing operation (during the shutter opening). However, the movement of the Z stage 14 during one exposing operation is only in one direction from down to up or from up to down. This is for maximally enhancing the throughput.

So, each functional unit in the MCU 18D will hereinafter be described with reference to FIG. 13. The MCU 18D is constructed chiefly of a central processing unit (CPU) 300, and is provided with a timer 301 adapted to start time counting in response to a shutter opening command TG during exposure, a data memory portion 302 storing therein various parameters for determining the operational condition of the Z stage 14, a digital-analog converter (DAC) 303 for outputting a target value DS to the Z-DRV 18C, an analog-digital converter (ADC) 304 for converting the level of the detection output (S curve signal) FS from the PSD 18B into a digital value, a position detecting circuit 305 for generating the information ES of the amount of movement of the Z stage 14 by the motor 15 as a digital value, and a time monitor portion 306 for monitoring the real time from after the shutter begins to be opened until it is completely closed. The CPU 300 exchanges information among the timer 301, the memory portion 302, the DAC 303, the ADC 304, the position detecting circuit 305 and the time monitor 306 and executes a series of operations.

Again in the present embodiment, as in the projection exposure apparatus shown in FIG. 4, a rotary shutter 3 is disposed to change over the interception and passage of the illuminating light to the reticle R. The rotary shutter 3 is rotated by a motor 4 and the control thereof is effected by a shutter driving portion 22. The shutter driving portion 22 is responsive to the shutter opening command TG to rotate the motor 4 to a position in which the blades of the rotary shutter 3 do not intercept the illuminating light. When the shutter 3 is opened and the illuminating light arrives at the reticle R, part of the illuminating light is also received in a quantity corresponding thereto by a photoelectric sensor 20. The photoelectric signal of the photoelectric sensor 20 is input to an integrator 21, whereby an integrated value corresponding to the exposure amount on the wafer W is calculated. A value corresponding to a target exposure amount (a proper exposure amount) is set in a setting portion 45, and the integrator 21 judges whether the integrated value coincides with the target value, and when it coincides with the target value, the integrator 21 outputs a command for closing the shutter 3 to a shutter driving portion 22. Thereby, there is provided an automatic exposure control system for making the exposure amount in each shot given to the wafer W substantially constant.

In the above-described construction, the XY stage 13 is moved in the step and repeat fashion to expose the pattern of the reticle R onto each of a plurality of shot areas on the wafer W, and when each shot area is positioned just beneath the projection optical system PL, an exposure starting command TG is immediately sent from the host computer (the main controller 100 in FIG. 4). However, when the alignment of each shot area such as die by die alignment or site by site alignment is to be effected after the stepping, the exposure starting command TG is sent after that alignment is completed.

Figure 14A:
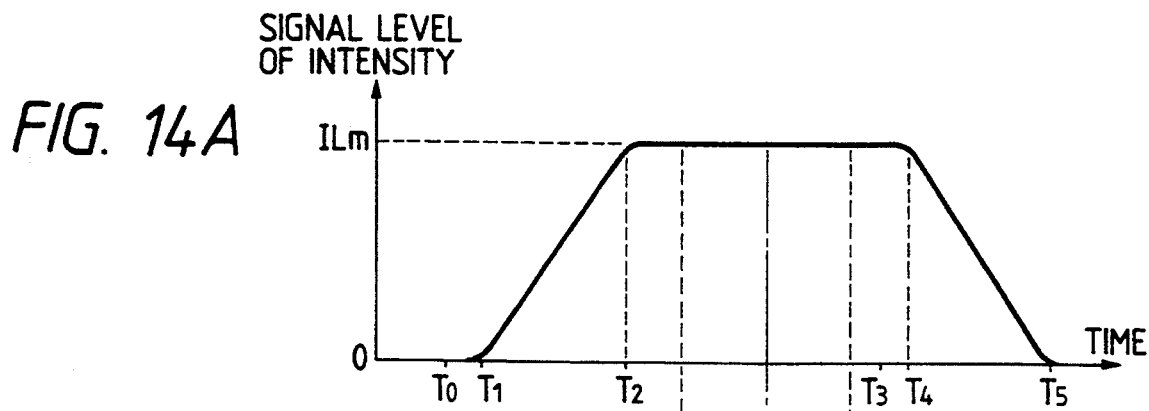
FIGS. 14A and 14B are graphs showing the shutter characteristic and the movement characteristic of the Z stage.

FIG. 14 illustrates the waveform of the photoelectric signal from the photoelectric sensor 20, i.e., the coordination (timing association) of the exposing operation and the position change characteristic of the Z stage 14 in Z direction (the direction of the optic axis AX), and is equal to FIG. 6A. FIG. 14A shows an example of the waveform of the photoelectric signal from the photoelectric sensor 20, and the ordinate of this figure represents the signal level and the abscissa represents time. The waveform of FIG. 14A primarily corresponds to the variation in the illuminance on the reticle R or the wafer W. In FIG. 14A, the shutter starting command TG is generated at time $T_0$, and the shutter 3 begins to pass the illuminating light therethrough at time $T_1$ later by some lag time (of the order of several milliseconds). The shutter becomes fully open at time $T_2$ after the lapse of a substantially constant time (of the order of 10–30 milliseconds), and is stopped in a state in which the signal level is a maximum value ILm. In the meantime, the integrator 21 continues the operation of integrating the level of the photoelectric signal, and outputs a closing command to the shutter driving portion 22 at time $T_3$ when the target value has been reached. At time $T_4$ later by a substantially constant lag time (of the order of several milliseconds), the shutter 3 begins to intercept the illuminating light and at time $T_5$, the shutter completely intercepts the illuminating light and is stopped. Here, the opening operation time from the time $T_1$ till the time $T_2$ and the closing operation time from the time $T_4$ till the time $T_5$ become substantially equal values, and each operation time and the lag times ($T_1-T_0$, $T_4-T_3$) become substantially constant values in conformity with the mechanical characteristic, electrical characteristic, etc. of the shutter. The shutter real time monitor 306 in FIG. 13 outputs to the CPU 300 a digital value corresponding to the time from the time $T_1$ till the time $T_5$ in FIG. 14A.

Figure 14B:
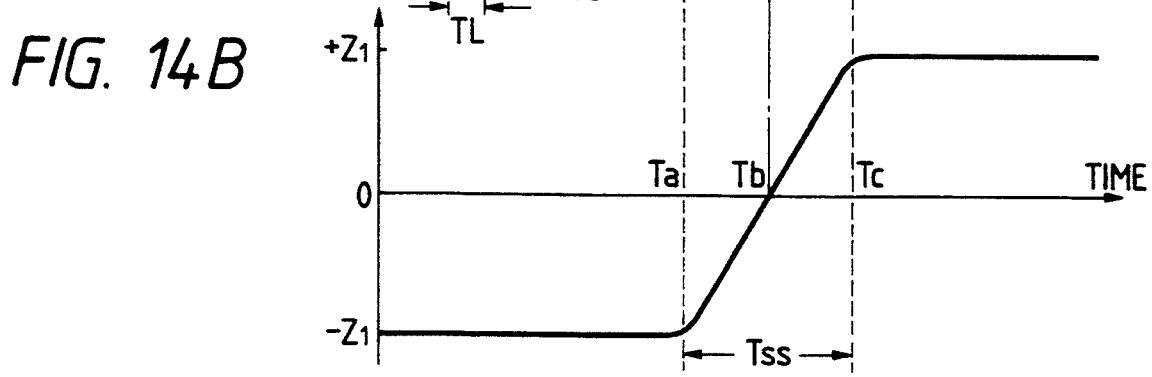

FIG. 14B shows an example of the position change characteristic of the Z stage 14 (or the surface of the wafer W) ideally associated with the exposing operation of FIG. 14A in Z direction (the direction of the optic axis AX), and the ordinate of this figure represents the Z position and the abscissa represents time. The zero point of the Z position of FIG. 14B indicates the best focus position detected as the in-focus point by the AF system, and it is to be understood here that the Z stage 14 is moved within the range of $\pm Z_1$ about the best focus position. That is, considering that during one exposing operation, the best imaging plane of the projection optical system PL exists at the position of the zero point in FIG. 14B, it follows that relative thereto, the surface of the wafer W has continuously moved in Z direction from a position $-Z_1$ to a position $+Z_1$. In FIG. 14B, at the start of exposure, the Z stage 14 is at the position $-Z_1$, and is moved at a velocity Vs from time Ta when the shutter is fully open, and arrives at the position $+Z_1$ at time Tc and is stopped thereat. Time Tb when the surface of the wafer W crosses the best imaging plane (the zero point) is substantially intermediate of the times Ta and Tc and is the middle point of the actually effective exposure time ($T_5-T_1$).

Figure 15:
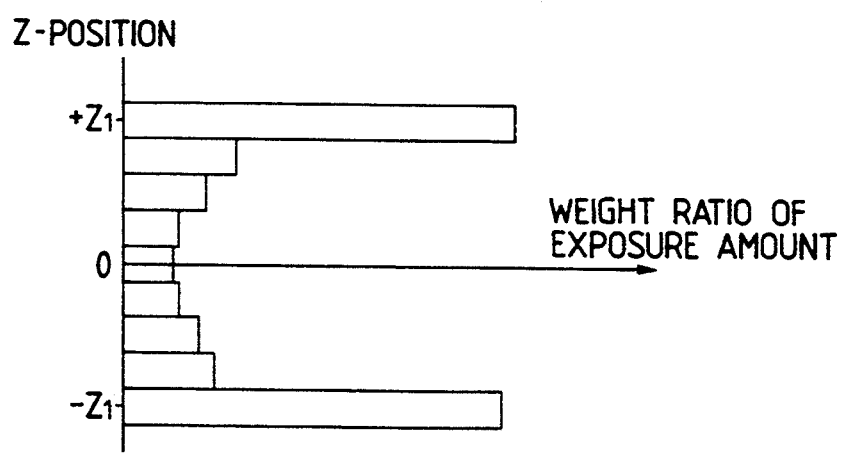
FIG. 15 is a graph showing an example of the weight ratio of the exposure amount in the direction of the optic axis.

When in this manner, during one exposing operation, the Z stage 14 is moved within the range of $\pm Z_1$ under the timing condition as shown in FIG. 14B, the weight of the exposure amount obtained at each minute Z position in the direction of the optic axis AX becomes maximum near the positions $-Z_1$ and $+Z_1$ as shown in FIG. 15, and becomes very small at the Z position therebetween. As a result, there is obtained a focus enlarging effect substantially equal to the conventional two-time exposure system (U.S. Pat. No. 4,869,999). In FIG. 15, the ordinate represents the Z position and the abscissa represents the weight ratio (or relative weight) of the exposure amount, and this figure corresponds to FIG. 7 or FIG. 9.

The operation of the present apparatus will now be described with respect, for example, to a case where exposure is effected for each shot area (exposed area) on the wafer W in the step and repeat fashion. However, it is to be understood that before the first shot exposure of the wafer W, one actually effective exposure time ($T_5-T_1$) is found substantially accurately by the real time monitor 306 or by calculation. It is also to be understood that the velocity Vs of the Z stage 14 during the exposing operation, the swing width $\pm Z_1$ of the Z stage 14, etc. are stored as initial values in the data memory portion 302. The swing width $\pm Z_1$ can be suitably designated by the operator.

The CPU 300 of FIG. 13 determines the movement starting time Ta and movement stopping time Tc of the Z stage 14 at a point of time whereat the actually effective exposure time ($T_5-T_1$), the velocity Vs and the swing width $\pm Z_1$ have been given.

First, the velocity Vs is a value inherent to the Z stage and is usually set to the vicinity of the maximum velocity. So, from the absolute value $2Z_1$ of the swing width and the velocity Vs, the time Tss from the time Ta till the time Tc is found by the calculation of $2Z_1/Vs$. However, the velocity of the Z stage 14 never becomes linear as per the set value Vs during the start and stoppage and therefore actually it need be a value somewhat greater than the time Tss found by the calculation.

Subsequently, the CPU 300 finds ½ of the value of the actually effective exposure time ($T_5-T_1$) minus the time Tss. This value corresponds to the time Te from the time $T_1$ till the time Ta (or the time from the time Tc till the time $T_5$), and thus the movement starting timing (time Ta) of the Z stage 14 has been specified. Instead of specifying the time Ta with the time $T_1$ as a reference, the generation time $T_0$ of the shutter opening command TG may be used as a reference. In that case, the lag time ($T_1-T_0$) is added to the time Te.

When the above-described calculation is terminated, the CPU 300 preserves the value of the time Te or Te+($T_1-T_0$) as one of initial parameters in the data memory portion 302. At this time, the CPU 300 also calculates the time (Te+Tss/2) till the middle point time Tb of the actually effective exposure time ($T_5-T_1$), or time (Te+Tss/2+$T_1-T_0$) and preserves it as one of the initial parameters in the memory portion 302.

Figure 16:
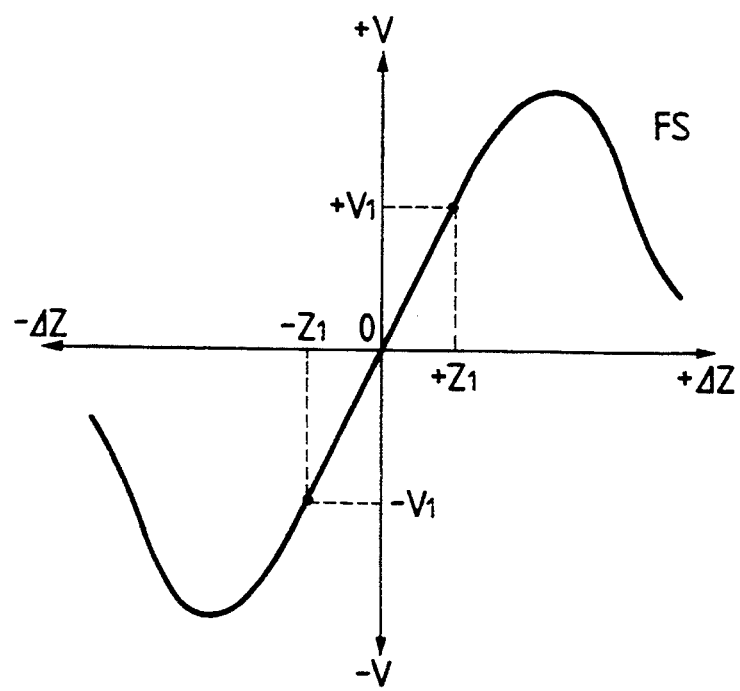
FIG. 16 shows the waveform of a synchronous detection output signal.

Now, in the present embodiment, design is made such that the target value DS output from the DAC 303 is varied correspondingly to the positions $\pm Z_1$ in order to move the Z stage 14 as shown in FIG. 14BB. This will hereinafter be described. FIG. 16 shows an example of the variation characteristic of the detection output FS from the PSD 18B, and the ordinate of this figure represents voltage (level) and the abscissa represents the amount of deviation of the focus (the amount of deviation between the best focus plane and the surface of the wafer) $\Delta Z$. The detection output FS has a range in which the voltage V and the amount of deviation $\Delta Z$ become linear about the zero point (the in-focus point), and the detection output FS assumes a voltage $+V_1$ when the surface of the wafer W is displaced from the in-focus point to the position $+Z_1$, and assumes a voltage $-V_1$ when the surface of the wafer W is displaced to the position $-Z_1$.

So, assuming that the target value DS output from the DAC 303 is fixed at $-V_1$, the servo control of the Z stage 14 is effected so that the surface of the wafer W may come from the best focus plane to the position $-Z_1$.

Figure 17:
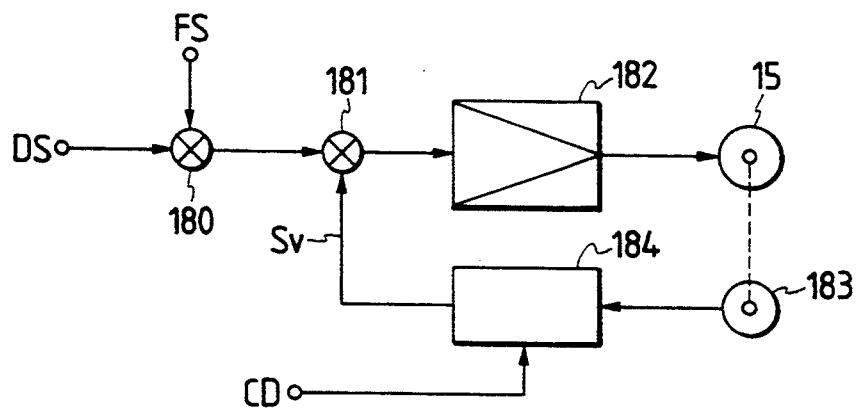
FIG. 17 shows an example of the construction of a driving circuit for the Z stage.

FIG. 17 shows the construction of the Z-DRV 18C for the motor 15 of the Z stage 14, and a differential amplifier 180 outputs the difference between the detection output FS and the target value DS, and a differential amplifier 181 outputs the difference between the detection output FS and the velocity feedback signal Sv to a power amplifier 182. The motor 15 rotates at a speed conforming to the driving voltage of the power amplifier 182 and the rotational speed thereof is detected by a tachogenerator 183. A feedback circuit 184 applies integrating process, gain correction, etc. to the detection signal from the tacho-generator 183 and outputs said detection signal as the feedback signal Sv. This circuit is a speed feedback system for stabilizing the rotational speed during the driving of the motor 15, and in the present embodiment, it is endowed with the function of reducing the gain to the feedback signal Sv from the feedback circuit 194 in response to a command CD from the CPU 300. That is, it creates a state in which the speed feedback amount has been minimized, thereby heightening the rotational speed of the motor 15 and thereby maximizing the movement velocity Vs of the Z stage 14. The speed control of the motor 15 is not restricted to that by the construction described above, but any control matching the servo system of the motor 15 can suitably be utilized.

In the construction of FIG. 17, when the target value DS is varied to $+V_1$ from a state in which the target value DS is zero and the detection output FS is also stable at the zero point, the motor 15 begins to rotate at a high speed from that moment and the Z stage 14 is moved from the zero point to the position $+Z_1$. When the Z stage 14 comes to the position $+Z_1$, the motor speed becomes stabilized at DS=FS=$+V_1$ and the system thereof is stabilized. Accordingly, the swing width of the Z stage 14 in the present embodiment is limited to a linear range in terms of the characteristic of the detection output FS, but this is a range sufficient to cope with because the optimum swing width for obtaining the effect of enlarging the depth of focus is considered to be of the order of the width of the depth of focus of the projection optical system (e.g. $\pm\mu 1$ m). When it is desired to make the swing width of the Z stage 14 greater than that, the inclination of the halving glass 17F shown in FIG. 12 can be continuously changed as indicated by the characteristic of FIG. 14B during the movement period of the Z stage 14, i.e., during the time Ta to the time Tc in FIG. 14B and also, the Z stage 14 (the motor 15) can be servo-controlled so that the zero point (or a predetermined voltage point) of the detection output FS may always be obtained.

Figure 18:
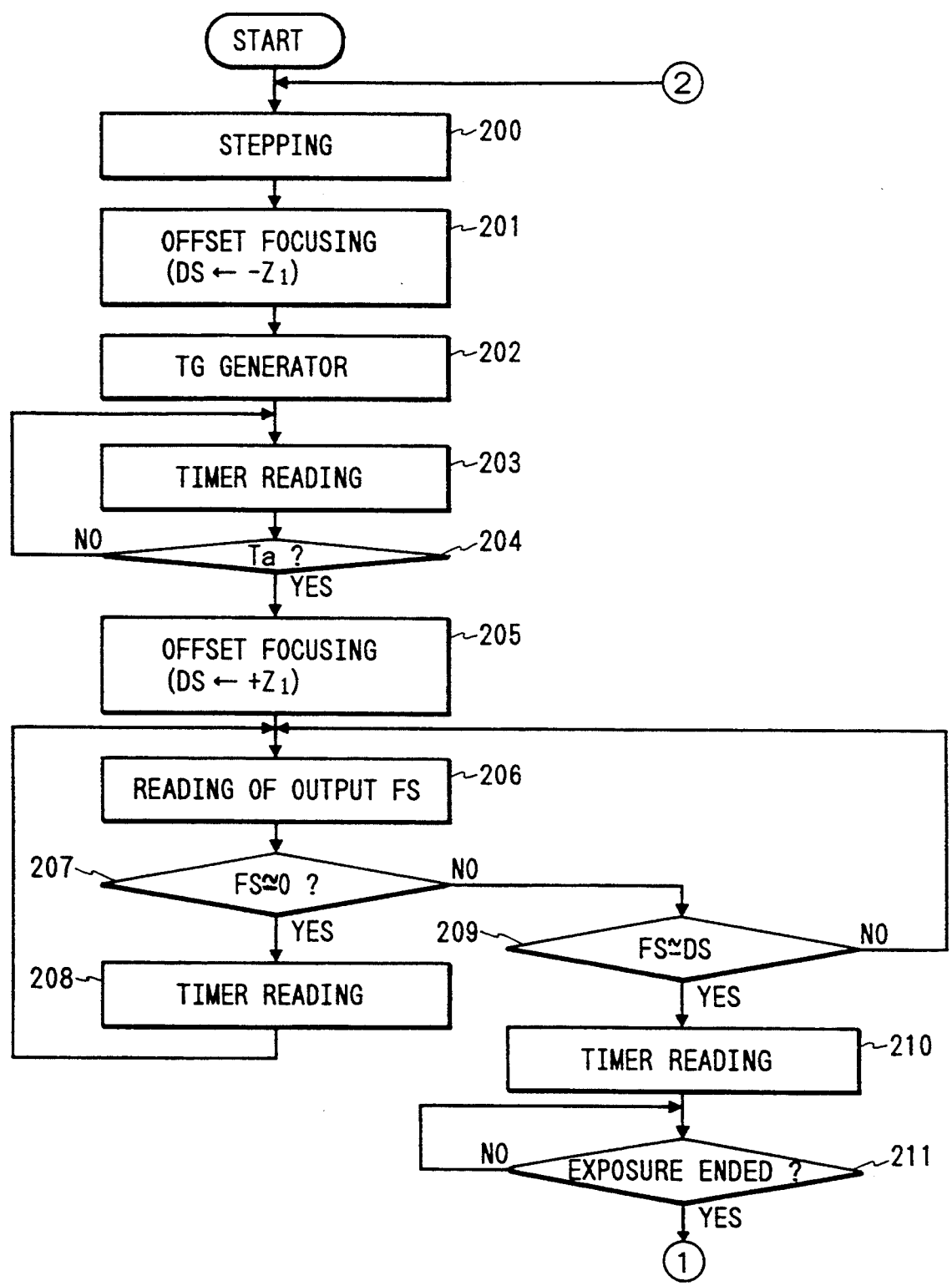
FIG. 18 a flow chart showing an example of the operation.
Figure 19:
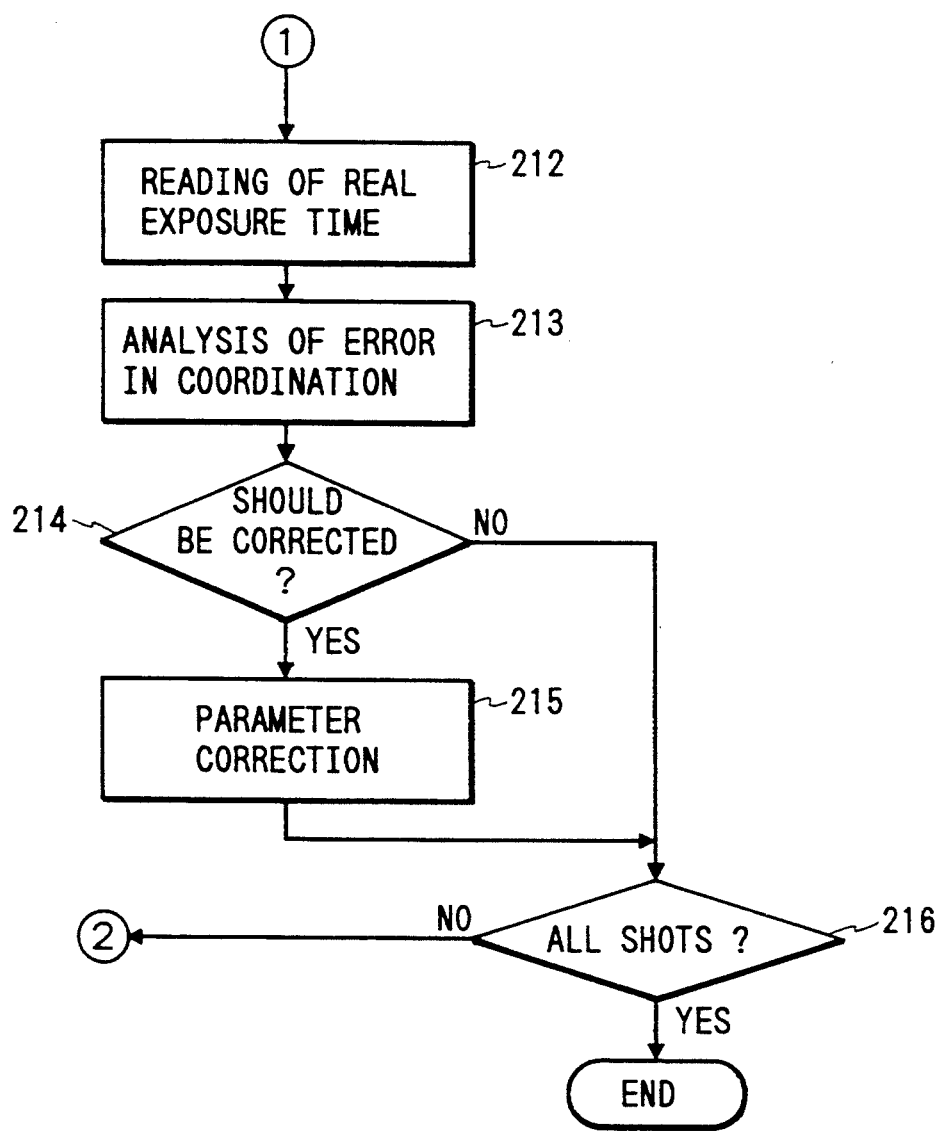
FIG. 19 is a flow chart showing an example of the operation.

Now, exposure of the step and repeat type to a wafer W is executed in accordance with flow charts shown in FIGS. 18 and 19. These flow charts are executed chiefly by the CPU 300 and have portions which should originally be processed by the interrupt system, but are shown in the form of a single routine for the ease of understanding.

First, the host computer (the main controller 100 of FIG. 4) designates the stepping coordinates to bring the position of the XY stage 13 to such coordinates that the first shot on the wafer W is exposed. Thereby, the XY stage 13 is stepped so that the first shot may come to the position of the projected image from the projection optical system PL (step 200). At this time, the CPU 300 outputs to the DAC 303 a digital value which will render the same value as the level of the detection output FS corresponding to the position $-Z_1$, i.e., the voltage $-V_1$, into the target value DS on the basis of the value of the swing width set in the data memory portion 302 (step 201). Thereby, the Z stage 14 is servo-locked at such a position that the surface of the wafer is displaced by $-Z_1$ relative to the focus plane.

When the positioning of the XY stage 13 and the Z stage 14 is completed and these stages become stationary, at a step 202, the shutter opening (exposure starting) command TG is generated and the driving of the motor 4 for the shutter 3 is started and at the same time, the quantity-of-light integrating operation of the integrator 21 and the time counting of the timer 301 are started. Thereafter, at a step 203, the CPU 300 reads the time count value of the timer 301, and at a step 204, it judges whether that value has reached the driving start time Ta of the Z stage 14. As previously described with reference to FIGS. 14A and 14B, the time from after the starting command TG has been generated till the start time Ta is set as Te+($T_1-T_0$) in the memory portion 302 and therefore, at the step 204, the CPU 300 judges whether the time count value of the timer 301 has become Te+($T_1-T_0$). In the meantime, the shutter real time monitor 306 starts time counting from the time $T_1$ when the shutter 14 begins to pass the illuminating light therethrough.

When it is judged that the start time Ta of the Z stage 14 has been reached, at a step 205, the CPU 300 outputs to the DAC 303 a digital value for rendering the target value DS into a voltage $+V_1$ corresponding to the position $+Z_1$ of the Z stage 14. Along therewith, the Z-DRV 18C shown in FIG. 12 starts to move the Z stage 14 substantially at the highest velocity from the position $-Z_1$ toward the position $+Z_1$. Immediately thereafter, the CPU 300 reads the level of the detection output FS of the PSD 18B through the ADC 304 (step 206), and judges at a step 207 whether that level has become substantially zero. The detection of whether the detection output FS has become substantially zero will be more realistic if it is effected by passing the output FS through a zero detecting comparator of narrow window width or the like and applying interruption to the CPU 300 in response to the zero detection signal (pulse) thereof.

Now, immediately after the Z stage 14 has started its movement toward the position $+Z_1$, the detection output FS has not yet reached the zero point and therefore, the judgment at the step 207 is "No", and the CPU 300 advances the sequence to a step 209. Also, if it is judged at the step 207 that the detection output FS is zero, the CPU 300 reads, at a step 208, the time count value Tmc of the timer 301 and stores it into the data memory portion 302. This time count value Tmc is used to check up later whether the time Tb in FIG. 14B has coincided with the middle point of the real exposure time $(T_5-T_1)$. After the step 208, the CPU 300 returns the sequence to the step 206. The condition branching-off from the step 207 to the step 208 may be limited to once or may not be limited at all.

Thus, the loop of the steps 206, 207 and 209 is executed until the Z stage 14 arrives at the position $+Z_1$ after the detection output FS has crossed the zero point, and when the level of the detection output FS becomes substantially equal to the target value DS ($+V_1$) set at the step 205, at a step 210, the CPU 300 reads the then time count value Tme of the timer 301 and stores it into the memory portion 302. Thereafter, at a step 211, the CPU 300 waits for the termination of the exposing operation for the first shot. The read time count value Tme is used to check up the termination time Tc of the movement of the Z stage 14 in FIG. 14B.

When the exposure of the first shot is thus terminated, at the step 212 of FIG. 19, the CPU 300 reads the real exposure time $(T_5-T_1)$ from the real time monitor 306 and stores it into the memory portion 302. At the next step 213, the CPU 300 analyzes an error in the coordination (timing relationship) of the exposing operation by the driving of the shutter 3 and the movement control of the Z stage 14. The CPU 300 first subtracts the movement time of the Z stage 14, i.e., the difference time Tss' between the time count value Tme and the time count value $(Te+T_1+T_0)$, from the real exposure time $(T_5-T_1)$ for the first shot. Further, the CPU 300 finds the value Te' of ½ of the time obtained by subtracting the time Tss' from the real exposure time $(T_5-T_1)$. If there is no error, this time Te' becomes equal to the time $(Ta-T_1)$ and the time $(T_5-Tc)$ in FIG. 14B. However, with regard particularly to the first shot, there is a great possibility that the values of those three, i.e., the time Te', the time $(T_5-T_c)$ and the time $(Ta-T_1)$ become greatly different from one another.

So, in the present embodiment, the error $\Delta Te'$ between the time Te' and the time $(T_5-Tc)$ is calculated and whether it is equal to or greater than an allowable amount. Here, the time $(T_5-Tc)$ can be found by further subtracting the value of the time count value Tme read at the step 210 when the Z stage 14 has come to the position $+Z_1$, minus the lag time $(T_1-Tb)$ during the start of shutter opening from the real exposure time $(T_5-T_1)$ read by the real time monitor 306. When the error $\Delta Te'$ is equal to or greater than the allowable value, at a step 214, the CPU 300 judges that the error should be corrected, and at a step 215, it corrects the parameter in the memory portion 302. Specifically, the time $(Te+T_1-T_0)$ till the movement start of the Z stage 14 set before the exposure of the first shot can be renewed to a time $(Te+T_1-T_0-\Delta Te')$ corrected by the error $\Delta Te'$.

As another correcting method, it is conceivable to judge whether ½ of the real exposure time $(T_5-T_1)$ of the first shot and the time count value Tmc read at the step 208 minus the lag time $(T_1-T_0)$ are substantially equal to each other, and apply a correction to the time $(Te+T_1-T_0)$ as the error $\Delta Te'$ when the error therebetween is equal to or greater than the allowable value.

Subsequently, at a step 216, the CPU 300 judges whether the exposing operation for all shots on the wafer W has been terminated, and if said exposing operation has not been terminated, the CPU 300 again executes the sequences from the stem 200 of FIG. 18. The series of sequences of the above-described steps 200 to 216 are repeated for each shot on the wafer W, and the accuracy of the coordination of the operation of the shutter 3 (the shot exposing operation) and the movement of the Z stage 14 is enhanced more in the second shot than in the first shot, more in the third shot than in the second shot, and so on. That is, the coordination (timing relationship) learned during the shot exposure immediately before is always reflected in the coordination control during the subsequent shot exposure.

As described above, in the fourth embodiment, design is made such that the timing of the shutter operation and the movement of the Z stage in terms of time is analyzed to optimize the coordination, but besides, the weight ratio of exposure amount as shown in FIG. 15 can be analyzed to optimize the coordination. As regards also the parameter correction, not only time but also the preset movement velocity Vs of the Z stage 14 can be delicately varied.

Further in the fourth embodiment, the time Tmc during which the surface of the wafer crosses the best focus plane is monitored and therefore, the velocity irregularity of the Z stage 14 can also be specified to a certain degree, whereby such parameter correction that will control the velocity characteristic is also possible. Considering the time counting by the timer 301 as a reference, the Z stage 14 is started after the lapse of a time $(Te+TL)$ when the lag time $(T_1-T_0)$ is regarded as time TL, crosses the zero point at the time Tmc, and is stopped at the time Tme.

Therefore, ideally, it ought to follow that $(Te+TL+Tme)/2=Tmc$. However, if there is a difference between the velocity change during the start of the Z stage 14 (the rising characteristic) and the velocity change during the stoppage of the Z stage 14 (the falling characteristic), it follows that the symmetry thereof is greatly destroyed. So, the symmetry of the velocity characteristic can be found about the time when the Z stage 14 crosses the zero point, and the velocity control of the Z stage 14 can be adjusted if the symmetry is bad. Specifically, such a command CD which will vary the velocity feedback amount by the feedback circuit 184 as shown in FIG. 17 between the movement starting point to the stopping point of the Z stage 14 can be given.

Now, in the above-described embodiment, the depth-of-focus enlarging effect obtained at the first shot for the wafer W cannot always be said to be stable. Therefore, the pattern resolution in the first shot becomes insufficient and it may happen that the wafer becomes inferior as a device chip.

Figure 20:
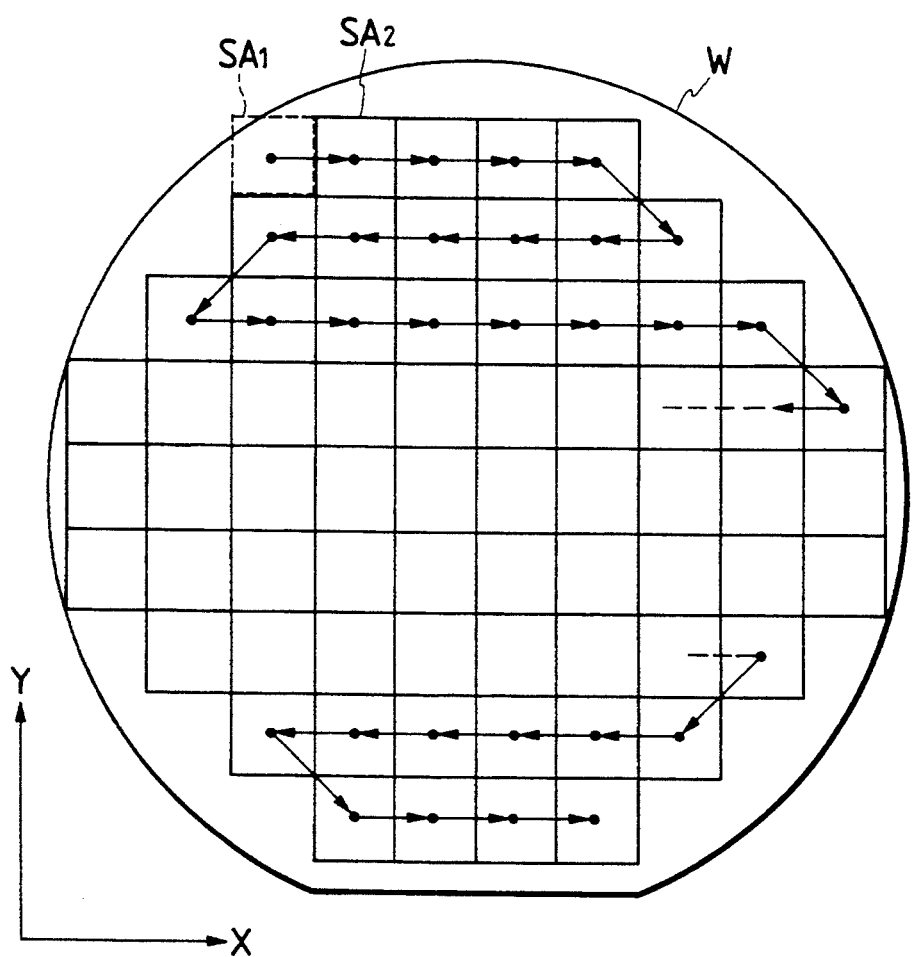
FIG. 20 is a shot arrangement map showing the exposure sequence on a wafer.

So, as shown in FIG. 20, of the shot areas arranged on the wafer W, the first shot is always designated so as to expose a shot $SA_1$ which will be partly broken on the marginal edge of the wafer W. The exposure to this broken shot $SA_1$ is a kind of dummy exposure. In FIG. 20, arrows liking the centers of respective squares represent the direction of stepping by the XY stage 13. Also, when it is desired to expose the resist on the marginal edge portion of the wafer as well, stepping is effected so as to expose all broken shots existing on the marginal edge portion as well. So, the correction of the parameter may be effected during the exposure of the broken shot. In this case, as long as normal shots are exposed, the correction of the parameter is not effected and the steps 212–215 of FIG. 19 are executed by the last one of normal shots continuously exposed to thereby effect the correction of the parameter.

The correction of the parameter is possible not only by the adjustment of the velocity and driving timing of the Z stage, but also by the adjustment of the opening time of the shutter 3. In that case, the intensity of the illuminating light on the reticle R when the shutter is fully open is changed to thereby change the real exposure time $(T_5-T_1)$ for obtaining a proper exposure amount. Generally the light source used in an apparatus of this kind is a mercury discharge lamp and therefore, the intensity of the illuminating light can be adjusted by varying the input electric power to the discharge lamp. As a case where the correction of the parameter for changing the real exposure time $(T_5-T_1)$ is effective, mention may be made of a case where high sensitivity resist or the like is used and the fully opening time of the shutter becomes very short. If in this case, the coordination of the movement characteristic of the Z stage 14 and the operational characteristic of the shutter deviates slightly, the balance of the weight ratio of the exposure amount at the Z positions $\pm Z_1$ may sometimes differ greatly. So, the input electric power to the discharge lamp can be reduced slightly (e.g. by the order of 10–30%) to thereby lengthen the fully opening time of the shutter.

Further, in the above-described fourth embodiment, during one exposing operation, the Z stage 14 is moved in the direction of the optic axis, that is, the wafer is moved in the direction of the optic axis relative to the best imaging plane of the projection lens PL, but alternatively, the wafer may be fixed and the best imaging plane may be moved in the direction of the optic axis. Specifically, offset which will vary by a predetermined amount during one exposing operation can be applied to the command value $S_{12}$ to the pressure regulator 52 shown in FIG. 11. If this is done, the focus position of the projection lens PL itself (the position of the best imaging plane conjugate with the reticle R) will vary by a minute amount and therefore, an effect equal to that of the previous embodiment will be obtained without involving any mechanical driving. However, the time variation characteristic of the pressure offset to be applied during one exposing operation has a tendency similar to that shown in FIG. 14B.

Also, as a mechanical driving system, the reticle R can be moved in the direction of the optic axis or the lens element in the projection lens PL can be moved in the direction of the optic axis. Particularly where the reticle R is moved, the movement is enlarged to square times (25 times or 100 times) of the inverse number of the projection magnification (1/5 or 1/10) relative to the swing width $\pm Z_1$ when the wafer W is moved, and this leads to the advantage that mechanical driving control becomes easy.

In the fourth embodiment, as shown in FIGS. 14A and 14B, the Z stage 14 is moved with a velocity characteristic symmetrical with respect to the middle point (time Tb) of the real exposure time $(T_5-T_1)$, but setting need not always be done so that at the middle point of the real exposure time, the surface of the wafer may cross the best focus plane. In that case, the weight ratio of the exposure amount shown in FIG. 15 will assume different magnitudes at the Z positions $+Z_1$ and $-Z_1$. Such weighting of the exposure amount copes with being suitably changed by the operation depending on the thickness of the resist layer to be exposed, the structure of the resist layer, the material of groundwork, etc.

Also, where of the shutter characteristics shown in FIG. 14A, the opening operation time $(T_2-T_1)$ and the closing operation time $(T_5-T_4)$ differ from each other, even if the weights of the exposure amounts at the Z position $+Z_1$ are set equally, the middle point of the real exposure time $(T_5-T_1)$ and the timing at which the surface of the wafer crosses the best focus plane will somewhat deviate from each other. This tendency will become remarkable particularly when the fully opening time $(T_4-T_2)$ of the shutter becomes relatively short.

Thus, according to the fourth embodiment, a substantially stable depth-of-focus enlarging effect is obtained during each shot in which exposure is continuously effected onto the photosensitive substrate. Further, even if the intensity of the illuminating light for exposure fluctuates slightly while a photosensitive substrate is exposed, whereby the exposure time per shot is varied, the parameter is optimally corrected with that taken into account and therefore, exposure in which the weight ratio of the exposure amounts obtained at least two Z positions in the direction of the optic axis of the projection optical system is kept exactly constant becomes possible. Further, during one exposing operation, the Z stage is moved only in one direction and thus, there is obtained the effect that the throughput is higher than in the prior art. The fourth embodiment can also be applied to a stepper using an excimer laser or the like as a light source. In such case, the control of exposure amount by the shutter is not effected, yet the period of a plurality of (20–200) timings of the oscillation trigger pulse signal for the light emission of the excimer laser source and the operation timing of the Z stage can be monitored.

What is claimed is:

1. A projection exposure apparatus comprising:
   an illuminating system for illuminating a mask formed with a predetermined pattern;
   a shutter for changing over the supplying of illumination light to said mask and the intercepting of the illumination light;
   a projection optical system for projecting the pattern image of said mask;
   a movable stage holding a photosensitive substrate near the projection image plane of said projection optical system and capable of moving said photosensitive substrate in the direction of the optic axis while said shutter is open;

stage control means for controlling said movable stage with a predetermined operational characteristic;

shutter control means for controlling the opening-closing of said shutter on the basis of the quantity of the illumination light to said mask; and interlocking means for interlocking the operations of said shutter control means and said stage control means so that on the basis of the operational characteristic of said shutter and the operational characteristic of said movable stage, the distribution of an exposure amount provided to said photosensitive substrate from the opening operation starting point of time till the closing operation completing point of time of said shutter, with respect to the direction of the optic axis, may assume substantially equal maximum values at least two locations in the direction of the optic axis.

2. A projection exposure apparatus according to claim 1, wherein said shutter has such an operational characteristic that the opening operation time from the opening operation starting point of time till the opening operation completing point of time and the closing operation time from the closing operation starting point of time till the closing operation completing point of time become substantially equal to each other, and said interlocking means includes a speed interlocking control portion for setting the movement speed of said movable stage to substantially equal first values at the opening operation starting point of time and the closing operation completing point of time of said shutter, and setting the movement speed of said movable stage to a second value greater than said first values in the section existing in the period from the opening operation completing point of time till the closing operation starting point of time of said shutter.

3. A projection exposure apparatus according to claim 2, wherein said speed interlocking control portion sets the movement speed of said movable stage so that the time from said opening operation starting point of time till starting of said second value of the movement and the time from the termination of said second value of the movement till said closing operation completing point of time are substantially equal to each other.

4. A projection exposure apparatus according to claim 2, wherein said interlocking means includes a calculating portion for calculating an exposure time from said opening operation starting point of time till said closing operation completing point of time necessary to provide proper exposure to said photosensitive substrate, on the basis of the value detected by a photoelectric detector, and a judging portion for judging whether there is a difference between said exposure time and the time necessary for said movable stage to execute a speed variation determined by said speed interlocking control portion, and outputting a warning signal representative of becoming non- interlocking when said exposure time is shorter than said necessary time.

5. A projection exposure apparatus according to claim 4, wherein said interlocking means includes an illumination intensity regulating portion for regulating the intensity of illuminating light to said mask in conformity with said warning signal.

6. A projection exposure apparatus which has an illuminating system for illuminating a mask formed with a predetermined pattern, a projection optical system for projecting the pattern image of said mask, and a movable stage holding a photosensitive substrate to be exposed by said pattern image, near a projection image plane of said projection optical system, said apparatus comprising:

(a) illumination means for controlling start and end of illuminating said mask;

(b) stage drive means for driving said movable stage to move said photosensitive substrate in the direction of the optical axis of said projection optical system; and (c) velocity control means for outputting to said stage drive means such velocity control signals that a velocity of said movable stage takes a first value between a time point at the start of said illuminating and a predetermined time point prior to the end of said illuminating and takes a second value, which is larger than said first value, after said predetermined time point has been reached.

7. A projection exposure apparatus according to claim 6, wherein said illumination control means and said velocity control means are so synchronized that a surface of said photosensitive substrate may cross said projection image plane in one direction in a state where the velocity of said movable stage has taken said second value.

8. A projection exposure apparatus provided with a projection optical system for projecting the pattern of a mask onto a predetermined area on a photosensitive substrate, a two-dimensional stage for holding said photosensitive substrate and two-dimensionally moving it in a plane substantially perpendicular to the optic axis of said projection optical system to thereby successively expose different predetermined areas on said photosensitive substrate, spacing changing means for continuously changing the relative spacing between the imaging plane of said projection optical system and said photosensitive substrate with respect to the direction of said optic axis, and control means for operating said spacing changing means in operative association with an exposing operation for giving a proper exposure amount to said predetermined areas, characterized by the provision of:

state detecting means for detecting the state of the coordination of the operation of said spacing changing means and said exposing operation when a predetermined area on said photosensitive substrate which is to be precedently exposed is exposed under a preset operational condition; and correcting means for correcting a parameter prescribing the operational condition of said control means or a parameter prescribing the condition of the exposing operation, for a predetermined area exposed after said precedent predetermined area, when said detected state is improper.

9. A projection exposure apparatus according to claim 8, further provided with a light source generating illuminating light for exposure to said mask, a shutter for changing over the passage and interception of said illuminating light, a photoelectric sensor for receiving part of the illuminating light passed through said shutter and outputting a signal conforming to the intensity thereof, and shutter control means for detecting whether said proper exposure amount is given, and outputting a signal for closing said shutter when said proper exposure amount is reached.

10. A projection exposure apparatus according to claim 9, wherein said state detecting means includes a shutter monitor circuit for detecting the lapse of the operation time from the start of the opening of said shutter till the termination of the closing of said shutter, a circuit for detecting the operation timing of said spacing changing means correspondingly to the lapse of the time detected by said shutter monitor circuit, and a circuit for analyzing an error between the lapse of the operation time of said shutter and the operation timing of said spacing changing means.

11. A projection exposure apparatus according to claim 10, wherein said correcting means includes a timing correcting circuit for staggering the operation timing of said spacing changing means within the period of the operation of said shutter when the error found by said error analyzing circuit is equal to or greater than an allowable value.

12. A projection exposure apparatus according to claim 10, wherein said correcting means includes a speed adjusting circuit for adjusting the changing speed of said spacing changing means when the error found by said error analyzing circuit is equal to or greater than an allowable value.

13. A projection exposure apparatus according to claim 10, wherein said correcting means includes a circuit for changing the intensity of the emitted light of said light source to thereby adjust the time from the start of the opening of said shutter till the termination of the closing of said shutter when the error found by said error analyzing circuit is equal to or greater than an allowable value.

14. A projection exposure apparatus according to claim 8, wherein said state detecting means includes a circuit for analyzing the error of the operation timing of said spacing changing means relative to the lapse of the time of said exposing operation, and said correcting means includes a timing correcting circuit for staggering the operation timing of said spacing changing means when the error found by said error analyzing circuit is equal to or greater than an allowable value.

* * * * *